(12) United States Patent
Araki

(10) Patent No.: US 7,642,711 B2
(45) Date of Patent: Jan. 5, 2010

(54) FUNCTIONAL LAYER HAVING WIRING CONNECTED TO ELECTRODE AND BARRIER METAL BETWEEN ELECTRODE AND WIRING

(75) Inventor: Yasushi Araki, Kanagawa (JP)

(73) Assignee: FujiFilm Corporation, Tokyo (JP)

( * ) Notice: Subject to any disclaimer, the term of this patent is extended or adjusted under 35 U.S.C. 154(b) by 432 days.

(21) Appl. No.: 11/174,474

(22) Filed: Jul. 6, 2005

(65) Prior Publication Data

US 2006/0154034 A1 Jul. 13, 2006

(30) Foreign Application Priority Data

Jul. 6, 2004 (JP) ............ P.2004-199825

(51) Int. Cl.
*H01J 1/62* (2006.01)
*H01J 63/04* (2006.01)
(52) U.S. Cl. ............... 313/506; 313/498
(58) Field of Classification Search .......... None
See application file for complete search history.

(56) References Cited

U.S. PATENT DOCUMENTS

| 5,543,946 A | * | 8/1996 | Enomoto et al. | ............. 349/139 |
| 5,897,328 A | * | 4/1999 | Yamauchi et al. | ............. 438/29 |
| 7,057,208 B2 | * | 6/2006 | Akimoto et al. | ............. 257/59 |
| 7,180,110 B2 | * | 2/2007 | Komatsu et al. | ............. 257/291 |
| 7,227,518 B2 | * | 6/2007 | Eida | ............. 345/76 |
| 7,268,369 B2 | * | 9/2007 | Araki | ............. 257/83 |
| 7,417,249 B2 | * | 8/2008 | Akimoto et al. | ............. 257/59 |
| 2004/0195965 A1 | * | 10/2004 | Yamazaki et al. | ............. 313/506 |
| 2004/0222737 A1 | * | 11/2004 | Raychaudhuri et al. | ..... 313/504 |

FOREIGN PATENT DOCUMENTS

| JP | 58-103165 A | 6/1983 |
| JP | 2002-502120 A | 1/2002 |
| JP | 2002-83946 A | 3/2002 |
| JP | 2003-502847 A | 1/2003 |
| JP | 3405099 B2 | 5/2003 |

OTHER PUBLICATIONS

Sugimoto, A.; Ochi, H.; Fujimura, S.; Yoshida, A.; Miyadera, T.; Tsuchida, M., "Flexible OLED displays using plastic substrates," Selected Topics in Quantum Electronics, IEEE Journal of , vol. 10, No. 1, pp. 107-114, Jan.-Feb. 2004 URL:http://ieeexplore.ieee.org/iel5/2944/28712/01288078.pdf?isnumber=28712&prod=JNL&arnumber=1288078&arnumber=1288078.*

* cited by examiner

*Primary Examiner*—Toan Ton
*Assistant Examiner*—Britt D Hanley
(74) *Attorney, Agent, or Firm*—Sughrue Mion, PLLC

(57) ABSTRACT

A functional device having very good operation durability characteristics, high reliability and satisfactory performance is provided. The functional device provided is a functional device having: at least one functional layer deposited over a substrate wherein an organic material is included; and a plurality of electrodes for bringing the functional layer into action. And this functional device is provided with wiring connected to each of the plurality of electrodes and a barrier metal made to lie between at least one among the plurality of electrodes and the wiring connected thereto.

13 Claims, 29 Drawing Sheets

A-A CROSS SECTION

FUNCTIONAL LAYER HAVING WIRING CONNECTED TO ELECTRODE AND BARRIER METAL BETWEEN ELECTRODE AND WIRING

This application is based on Japanese Patent application JP 2004-199825, filed Jul. 6, 2004, the entire content of which is hereby incorporated by reference. This claim for priority benefit is being filed concurrently with the filing of this application.

BACKGROUND OF THE INVENTION

1. Technical Field of the Invention

The present invention relates to a functional device having a photoelectric conversion layer or a luminescent layer over a substrate in a deposited state.

2. Description of the Related Art

Functional devices using organic materials, notably organic luminescent devices, have made remarkable progress in recent years. And an organic EL display as a representative of organic luminescent devices has had a success in practical utilization. On the other hand, a photoelectric conversion device as an example of functional devices, though not yet successful in manufacturing, has made considerable strides in recent years, and has the potential to overcome problems facing the related art imaging devices, which are mentioned below. A related art solid-state imaging device, whether a CCD type or a CMOS type, includes a semiconductor substrate on the surface of which are formed a large number of photoelectric conversion devices (photodiodes) to function as light-receiving portions and signal readout circuit for reading out photoelectric conversion signals obtained from each photoelectric conversion device. The signal readout circuit is made up of charge transfer circuit and transfer electrodes in the case of CCD type, while it is made up of MOS transistor circuit and signal wiring in the case of CMOS type.

Therefore, the related art solid-state imaging devices require forming a great number of light-receiving portions and signal readout circuit on the surface of one and the same semiconductor substrate. So there is a problem that a sufficiently large area cannot be allocated to the light-receiving portions. Since the light availability of a solid-state imaging device is greatly reduced so far as a large area cannot be allocated to its light-receiving portions, light availability shortage in related art solid-state imaging devices has been supplemented by mounting microlenses or inner lenses on the upper parts of light-receiving portions and focusing light through these lenses onto the light-receiving portions. However, such a measure has inevitable problems including an increase in light quantity loss due to optical reflection, so it is said that the existing imaging devices have several tens of percentages of light quantity loss. In addition, the fineness requirements for solid-state imaging devices are becoming severer from year to year, and progress toward fining light-receiving portions leads to a problem that an incident light angle differential between the periphery and the center of an imaging device causes differences in light-gathering rates of microlenses to result in a shading phenomenon.

Therefore, opinions on the solid-state imaging device structure disclosed in JP-A-58-103165 have been changed for the better. This solid-state imaging device has a structure that signal readout circuit formed on the surface of a semiconductor substrate is deposited with photosensitive layers, and these photosensitive layers act as photoreceptor members and photoelectric conversion signals from these layers are taken out by the signal readout circuit, that is, a structure of photoelectric conversion layer-stacked type.

Such a structure can secure a large light-receiving area, and makes it possible to solve the aforementioned problem. Of late the solid-state imaging devices of photoelectric conversion layer-stacked type were proposed in JP-A-2002-83946, JP-T-2002-502120, JP-T-2003-502847 (the term "JP-T" as used herein means a published Japanese translation of a PCT patent application), and Japanese Patent No. 3,405,099. Application of an organic material-utilized device to the photoelectric conversion layer of the foregoing structure is highly desirable from the following viewpoints. It is relatively easy to adjust spectral wavelengths of organic materials by changing their chemical structures, and besides, the photoelectric conversion layer using an organic semiconductor can achieve a thickness of the order of 100 nm, so the total thickness can be held down even when a plurality of layers are deposited.

However, formation of functional devices by use of organic materials requires patterning electrodes on the functional layers, and fine patterning according to methods hitherto adopted suffers a problem that the devices formed deteriorate considerably in their performances. In the case of photolithographic processing in particular, there is a problem that since a development process after exposure is essential therein, purified water used for washing treatment in the development process reaches an organic semiconductor layer and degrades the organic semiconductor layer; as a result, there occurs a marked drop in device performance.

Further, organic material-utilized functional devices sometimes undergo deterioration from a migration of metals used in electrodes or wiring into adjacent layers, which is caused by an electric field applied to the electrodes between which organic layer is sandwiched and to the wiring under operation. In the case of photofunctional devices in particular, such as luminescent devices and photoreceptive devices, minimization of the area of contact regions is favorable for an increase in light-receiving area because the contact regions become light-screened regions. However, when the migration as mentioned above occurs in the minimized contact regions, contact performance is lowered and device functionality is substantially reduced.

Although metal oxides such as ITO are in the mainstream of conductive materials widely used as light-pervious electrodes in photofunctional devices, such metal oxide-utilized devices have a problem that the immediate contact between metal oxide and aluminum traces causes reaction between the oxygen and the aluminum to result in considerable decrease of contact performance.

SUMMARY OF THE INVENTION

The present invention has been made in view of the circumstances mentioned above, and aims to provide a functional device having very good operation durability characteristics and ensuring high reliability and satisfactory performance even in fine patterning.

The present functional device is a functional device having: one functional layer deposited over a substrate wherein an organic material is included; and a plurality of electrodes for bringing the functional layer into action. And this functional device is provided with wiring connected to each of the plurality of electrodes and a barrier metal made to lie between at least one among the plurality of electrodes and the wiring connected thereto.

By having this structure, it becomes possible to prevent a contact failure caused by migration of metal contained in the electrodes or the wiring into adjacent layers, and operation durability characteristics can be improved.

In the present functional device, it is preferable that the plurality of electrodes include a first electrode layer deposited over the substrate and a second electrode layer which is formed above the first electrode layer so that these electrode layers face each other across the functional layer.

The present functional device preferably has two or more multilayer structures, each of which is made up of the first electrode layer, the functional layer and the second electrode layer, over the substrate in a deposited state.

The present functional device preferably includes the first electrode layer and the second electrode layer which contain in their respective components at least one oxide selected from ITO, IZO, $SnO_2$, ATO, ZnO, $TiO_2$ or FTO.

In the present functional device, it is preferable that the second electrode layer is a light-pervious conductive oxide layer and the wiring contains aluminum. For instance, an aluminum-containing alloy, such as an alloy of Al and Si or an alloy of Al and Cu, can be used for the wiring.

The invention can fully achieve its effect in the case where a light-pervious conductive oxide layer is brought into contact with an aluminum-containing alloy, because migration becomes a serious problem in such a case.

In the present functional device, it is preferable that the organic material includes at least a hole transporting organic material and an electron transporting organic material.

In the present functional device, it is preferable that the hole transporting organic material and the electron transporting organic material are deposited in the order described, from lower to upper.

In the present functional device, it is preferable that the functional layers are layers working to form images, the second electrode layer is formed in a pixel-by-pixel split state, and each of the pixels has a contact region between the second electrode layer and the wiring.

In the present functional device, it is preferable that the barrier metal includes any of TaN, Ta, WN, TiW, WSi, TiSi, MoSi, Mo, Cr, TiN and TiSiN.

In the present functional device, it is preferable that the barrier metal is installed inside an aperture formed in at least one layer of insulation layers and the one of the insulation layers has water permeability of 10 $g/m^2 \cdot day$ or below.

By designing as mentioned above, the functional layers are prevented from suffering damage in photolithographic processing included in the process of forming the barrier metal.

In the present functional device, it is preferable that the smallest edge length of the barrier metal is 1 mm or below.

In the present functional device, it is preferable that the functional layer is a photoelectric conversion layer.

By designing as mentioned above, the imaging device using such a functional device can have improved performances.

In the present functional device, it is also preferable that the functional layer is a luminescent layer.

By designing as mentioned above, the display device using such a functional device can have improved performances.

According to the invention, it is possible to provide a functional device having very good operation durability characteristics and satisfactory performances.

DETAILED DESCRIPTION OF THE INVENTION

The invention is a functional device having at least one functional layer deposited over a substrate, which includes an organic material, and a plurality of electrodes for bringing the functional layer into action, and this functional device is characterized in that wiring connected to each of the plurality of electrodes is installed and a barrier metal is made to lie between at least one of the plurality of electrodes and the wiring connected thereto. Examples of a functional device include a photoelectric conversion layer-stacked solid-state imaging device in which a photoelectric conversion layer is utilized as a functional layer, and a luminescent device in which a luminescent layer is utilized as a functional layer. In general each of these functional devices is configured so that, in order to apply an electric potential to two electrode layers between which a functional layer is sandwiched in, conductor traces connected to a bonding PAD are connected to the two electrode layers, respectively. A characteristic feature of the invention consists in that a barrier metal lies between at least either of the two electrode layers and the conductor trace connected thereto, and the adoption of this structure makes it possible to achieve improvements in operation durability characteristics. As for the functional devices having such a feature, their structures are described below with photoelectric conversion layer-stacked solid-state imaging devices and luminescent devices taken as examples.

First Embodiment

Figure 5:
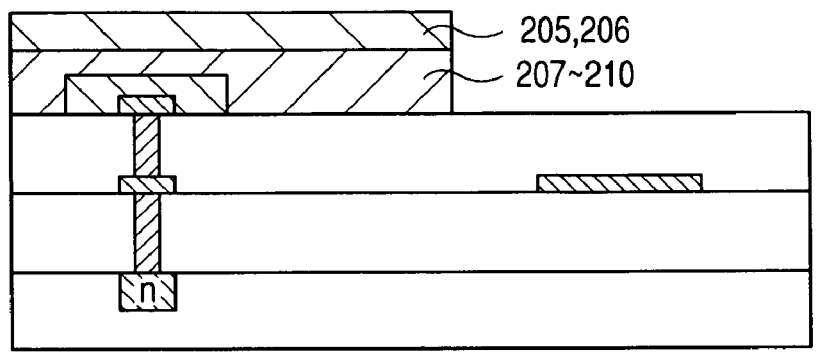
FIG. 5 is a schematic cross-sectional diagram illustrating a process of manufacturing the photoelectric conversion layer-stacked solid-state imaging device shown in FIG. 1.

The photoelectric conversion layer-stacked solid-state imaging devices can have various structures, including a first structure which permits color imaging by depositing above a silicon substrate three photoelectric conversion layers, each of which is made up of two electrode layers and an organic material sandwiched between them, and detecting lights of three different colors above the silicon substrate and a second structure which is like as the structure shown in FIG. 5 of JP-A-2003-332551 and permits color imaging by depositing above a silicon substrate one photoelectric conversion layer made up of two electrode layers and an organic material sandwiched between them, forming two pn junctions inside the silicon substrate at positions differing in depth and detecting lights of two different colors inside the silicon substrate and light of another color above the silicon substrate. Taking the second structure as an example, a first embodiment of the invention is illustrated.

Figure 1:
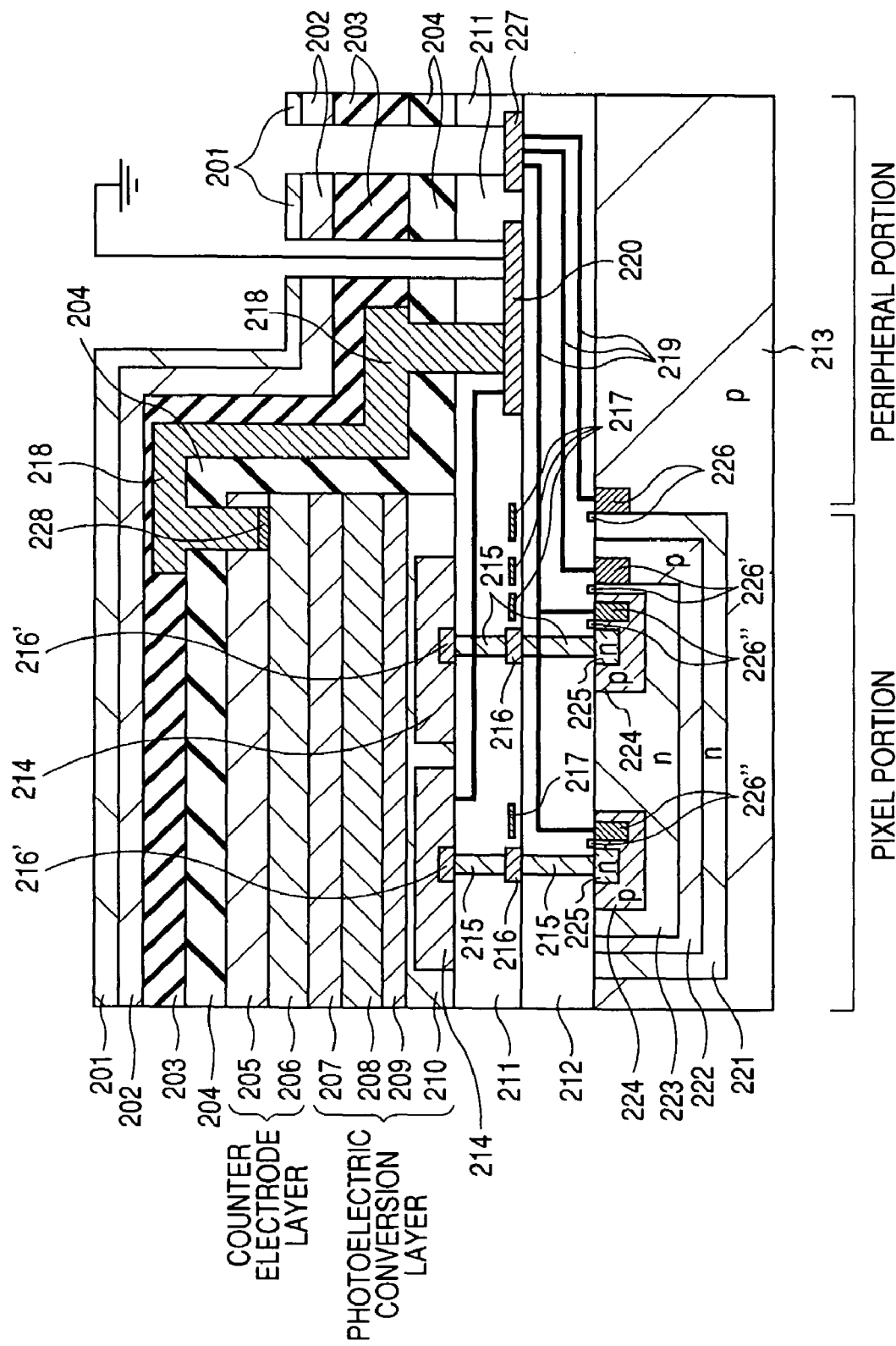
FIG. 1 is a schematic cross-sectional diagram of a photoelectric conversion layer-stacked solid-state imaging device for illustrating a first embodiment of the invention.

FIG. 1 is a schematic cross-sectional diagram of a photoelectric conversion layer-stacked solid-state imaging device for illustrating a first embodiment of the invention. In FIG. 1, sections of two pixels in the pixel area, wherein light is detected and electric charge is accumulated, and a section of the peripheral circuit area, where in wiring connected to electrodes in the pixel area and a bonding PAD connected to the wiring are formed, are shown in a combined state.

An n-type impurity zone 221 is formed in a surface part of the p-type silicon substrate 213 in the pixel area, a p-type impurity zone 222 is formed in a surface part of the n-type impurity zone 221, an n-type impurity zone 223 is formed in a surface part of the p-type impurity zone 222, and a p-type impurity zone 224 is formed in a surface part of the n-type impurity zone 223.

The n-type impurity zone 221 accumulates signal charge of red (R) component under photoelectric conversion by the pn junction with the p-type silicon substrate 213. A potential change in the n-type impurity zone 221, which is caused by accumulation of R-component signal charges, is read out to a signal readout PAD 227 from a MOS transistor 226 formed in the surface of the p-type silicon substrate 213 via a metal trace 219 connecting them.

The n-type impurity zone 223 accumulates signal charge of blue (B) component under photoelectric conversion by the pn junction with the p-type impurity zone 222. A potential change in the n-type impurity zone 223, which is caused by accumulation of B-component signal charges, is read out to a signal readout PAD 227 from a MOS transistor 226' formed in the surface of the p-type silicon substrate 213 via a metal trace 219 connecting them.

In the p-type impurity zone 224 is formed a charge accumulation zone 225 which has an n-type impurity zone and accumulates signal charge of green (G) component generated by a photoelectric conversion layer deposited above the p-type silicon substrate 213. A potential change caused in the charge accumulation zone 225 by accumulation of G-component signal charges is read out to the signal readout PAD 227 from a MOS transistor 226" formed in the surface of the p-type silicon substrate 213 via a metal trace 219 connecting them. In general the signal readout PAD 227 is provided individually for each transistor from which each color component is read out.

In FIG. 1, the p-type impurity zones, the n-type impurity zones, the transistors and the metal traces are schematically drawn, but most suitable structures may be selected for them, respectively, on a case-by-case basis without limiting to the structures shown. Since the B light and R light are separated by a difference in distance below the surface of the silicon substrate, it is important to properly select the distance between each pn junction and the silicon substrate surface and the concentration of each impurity as a dopant. And it is possible to apply technologies used in typical CMOS image sensors to CMOS circuit acting as the signal readout circuit of a photoelectric conversion layer-stacked solid-state imaging device. More specifically, circuit designs for reduction in the transistor count for the pixel area, including a low-noise readout column amplifier and CDS circuit, are applicable.

In FIG. 1, on the other hand, the charge accumulation zones 225 and the photodiodes for detecting R light and B light are installed in positions superposed at the sight of a plan view, but the invention should not be construed as being limited to such a configuration. For instance, the charge accumulation zones 225 and the photodiodes for detecting R light and B light may be arranged so that they are not superposed at the sight of a plan view.

On the p-type silicon substrate 13 is formed a transparent insulation layer 212 containing silicon oxide or silicon nitride as a main component. On the transparent insulation layer 212, a transparent insulation layer 211 containing silicon oxide or silicon nitride as a main component is further formed. And it is more advantageous for the insulation layer 212 to have less thickness. Specifically, the thickness of the insulation layer 212 is 5 μm or below, preferably 3 μm or below, far preferably 2 μm or below, particularly preferably 1 μm or below.

In the insulation layers 211 and 212 are formed plugs 215 each of which contains tungsten as a main component and connects electrically the photoelectric conversion layer to the n-type impurity zone 225 as a charge accumulation zone. And each plug 215 undergoes relayed connection via a pad 216 at the interface between the insulation layer 211 and the insulation layer 212. As the pad 216, a pad containing aluminum as a main component is preferred. In the insulation layer 212 are also formed the metal traces mentioned above and gate electrodes of the transistors 226, 226' and 226". And it is preferable to form a barrier layer including metal traces. The plug 215 is provided for each pixel.

In the insulation layer 211, lightproof layers 217 are installed in order to control noises coming from charge generation by the pn junction between the p-type impurity zone 224 and the n-type impurity zone 225. The lightproof layer 217 used herein generally contains tungsten or aluminum as a main component. In the insulation layer 211 are formed a bonding PAD 220 (a PAD for supplying power from the outside) and a signal readout PAD 227. And therein are also formed metal traces (not shown) for electrically connecting the bonding PAD 220 to a picture electrode layer 214 described below.

A pad 216' is formed on the plug 215 put for each pixel in the insulation layer 211, and on the pad 216' is formed a picture electrode layer 214 as a first transparent electrode layer. The pad 216' is provided for ensuring better electric connection between the plug 215 and the picture electrode layer 214, and formed with aluminum or molybdenum. The picture electrode layer 214 is divided among pixels, and the light-receiving area depends on the size of each piece of divided layer. To the picture electrode layer 214, a bias is applied via the conductor trace from the bonding PAD 220. And therein is preferred a structure enabling accumulation of electrons in the charge accumulation zone 225 by application of a bias positive for an counter electrode layer described below to the picture electrode layer 214.

In order to materialize such a structure, a hole blocking layer 210, an n-type semiconductor layer 209, a p-type semiconductor layer 208 and an electron blocking layer 207 are deposited on the picture electrode layer 214 in the order described, and these layers constitute a photoelectric conversion layer detecting G light and generating signal charge responsive thereto. The thickness of the photoelectric conversion layer is preferably 0.5 μm or below, far preferably 0.3 μm or below, particularly preferably 0.2 μm or below.

On the photoelectric conversion layer is formed a counter electrode layer as a second transparent electrode layer. The counter electrode layer has a double-layer structure that a transparent electrode layer 206 and a transparent electrode layer 205 are deposited in the order described. Alternatively, it may take a single-layer structure. The counter electrode can be shared among pixels, so it needn't be divided among pixels. The suitable thickness of the counter electrode layer is 0.2 μm or below, and that of the picture electrode layer 214 is also 0.2 μm or below.

On the counter electrode layer is formed a protective layer 204 containing silicon nitride as a main component and have the function of protecting the photoelectric conversion film. In the transparent electrode layer 205 and the protective layer 204, an aperture is formed at a position not lying above the picture electrode layer 214 in the pixel area, and another aperture is formed in the insulation layer 211 and the protective layer 204, and that at a position lying on a part of the bonding PAD 220. In order to apply a potential to the counter electrode by connecting electrically between the spots exposed by those apertures on the transparent electrode layer 206 and the bonding PAD 220, an aluminum-containing conductor trace 218 is formed inside the apertures and on the protective layer 204. As a material of the conductor trace 218, an aluminum-containing alloy, such as Al—Si or Al—Cu alloy, can also be used.

Between the transparent electrode layer 206 and the conductor trace 218 is formed a barrier metal 228 containing tungsten as a main component. This barrier metal is provided for the purpose of preventing deterioration from migration of metals used in the conductor trace 218 and the transparent electrode layer 206 into the adjacent layers when an electric field is applied to the conductor trace and the transparent electrode layer. As far as the spot of contact between the conductor trace 218 and the transparent electrode layer 206 is large in area, the contact performance can be retained even when migration occurs. In the solid-state imaging device shown in FIG. 1, however, the spot of contact between the conductor trace 218 and the transparent electrode 206 is formed in the pixel area, so it is difficult to increase an area of the contact spot. In this embodiment of the invention, therefore, a barrier metal 228 is provided and thereby the performance of contact between the conductor trace 218 and the transparent electrode layer 206 can be retained in spite of reduction in contact area and it becomes possible to improve operation durability characteristics. The suitable size of the contact spot (equivalent to the size of the barrier metal 228) is 1 mm or below in terms of the smallest side length on a condition that the shape is a square. Such a smallest side length is preferably 10 μm or below, far preferably 3 μm or below, particularly preferably 0.5 μm or below.

Additionally, the barrier metal 228 may be provided at the position between the bonding PAD 220 and the conductor trace 218, and it may be provided at the position between the conductor trace connecting the picture electrode layer 214 to the bonding PAD 220 and the picture electrode layer 214. Alternatively, the barrier metal may be provided at either of the above two positions. In the case of providing barrier metal in the pixel area, it is most suitable that the barrier metal is provided not only between the transparent electrode layer 206 and the conductor trace 218 but also between the conductor trace connecting the picture electrode layer 214 to the bonding PAD 220 and the picture electrode layer 214. This is because migration tends to occur at the spots where the conductor traces are connected to the picture electrode layer and the counter electrode layer when the photoelectric conversion layer including an organic material is used as in this embodiment of the invention.

Although the counter electrode layer is shared among pixels in this embodiment of the invention, it may be divided among the pixels. In this case, it is required to connect a conductor trace 218 to every piece of the divided counter electrode layer. This requirement may be addressed by forming a contact spot for connecting each piece of the divided counter electrode layer to the conductor trace 218 on each piece of the divided counter electrode layer at the position where the contact spot has no overlap with the facing picture electrode layer at the sight of a plan view, connecting a conductor trace to the contact spot via barrier metal and electrically connecting the counter electrode layer to the bonding PAD 220 through the conductor trace. The smaller the contact spot is in size, the larger the picture electrode layer can be rendered and an increase in light-receiving area becomes possible. When such a design is adopted, it becomes more difficult to increase the contact spot area. So it becomes important to provide barrier metal.

On the conductor trace 218 is formed a protective layer 203 that contains silicon nitride as a component and prevent damage to the conductor trace 218, on the protective layer 203 is formed an infrared-cutoff dielectric multilayer 202, and on the infrared-cutoff dielectric multilayer 202 is formed an antireflection layer 201. The protective layer 204 is provided, as described below, for facilitating processes of producing layers containing organic materials. Those layers in particular can lessen damage caused in the photoelectric conversion layer by resist pattern formation and etching operation for producing the conductor trace 218.

According to the structure as described above, BGR tricolor light can be detected by each pixel and color imaging can be performed. Although two pixels in the structure of FIG. 1 use R and B as a common value and G alone as different values, even such a structure can form color images of good quality because the G sensitivity is critical to forming images.

Additionally, the first electrode layer has no need for single-layer structure at all, but it may have a multilayer structure including two or more layers made up of different materials. In the case of such a multilayer structure, a photoelectric conversion layer-stacked solid-state imaging device having good operation durability can be obtained by making barrier metal lie between two electrode layers chosen from the constituent layers of the first electrode layer. A material especially suitable for the barrier metal is any of TaN, Ta, WN, TiW, WSi, TiSi, MoSi, Mo, Cr, TiN and TiSiN. When the barrier metal is selected from the materials recited above, it is particularly preferable to use as a constituent material of the first electrode layer at least one oxide selected from ITO, IZO, $SnO_2$, ATO, ZnO, $TiO_2$ or FTO.

Further, there is basically no harm in using any material for the first electrode layer and the second electrode layer. Examples of materials suitable for these electrode layers include metal, alloy, metal oxide, organic conductive materials and mixtures of two or more thereof can be suitably used. More specifically, it is appropriate to use combinations of any two or more elements selected from the group consisting of Li, Na, Mg, K, Ca, Rb, Sr, Cs, Ba, Fr, Ra, Sc, Ti, Y, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Al, Ga, In, Tl, Si, Ge, Sn, Pb, P, As, Sb, Bi, Se, Te, Po, Br, I, At, B, C, N, F, O, S and N. Of such combinations, those of any two or more elements selected from the group consisting of Al, Pt, W, Au, Ag, Ta, Cu, Cr, Mo, Ti, Ni, Pd and Zn are preferred over the others. In addition, even the materials used for the conductor trace 218 and the bonding PAD 220 may be the same ones as used for the first electrode layer and the second electrode layer.

Alternatively, it is greatly advantageous to use transparent materials for the first electrode layer and the second electrode layer. Examples of such materials include conductive metal oxides such as tin oxide, zinc oxide, indium oxide, indium zinc oxide (IZO) and indium tin oxide (ITO), thin semitransparent electrodes produced using metal such as gold, platinum, silver chromium and nickel, mixtures or deposits made up of these metals and conductive metal oxides, inorganic conductive materials such as copper iodide and copper sulfide, organic conductive materials such as polyaniline, polythiophene and polypyrrole, and deposits of ITO and any of the materials as recited above. Other materials usable for the electrode layers include those described in detail in books, e.g., *Tomei Dodenmaku no Shin-tenkai*, compiled under the supervision of Yutaka Sawada (published by CMC in 1999), and *Tomei Dodenmaku no Gijutu*, edited by Nippon Gakujutu Shinkokai (published by Ohmsha, Ltd. in 1999). And it is especially preferable in the invention that at least one among materials constituting each of the first electrode layer and the second electrode layer is ITO, IZO, $SnO_2$, ATO, ZnO, $TiO_2$ or FTO.

The first electrode layer can be formed using a material recited above as one example. The patterning of the first electrode layer may be performed using any method. Although patterns may be formed using print processes or mask processes, the patterning by use of photolithographic processes is preferred.

As the structure of the photoelectric conversion layer, not only the structure shown in FIG. 1, wherein an electron transporting material layer and a hole transporting material layer are sandwiched between an electron blocking layer and a hole blocking layer, but also [1] a structure having an electron transporting layer and a hole transporting layer in from-below-upward order and [2] a structure having a hole transporting layer and an electron transporting layer in from-below-upward order may be adopted. However, structures usable for the photoelectric conversion layer are not limited to those ones. For instance, an electron transporting material may be provided in a multilayer form, or a hole transporting material layer may be divided into two or more layers. In such a case, the photoelectric conversion layer may be thought to have [3] a structure that an electron transporting material layer, an electron transporting material layer and a hole transporting material layer are arranged in the order described, from lower to upper, [4] a structure that an electron transporting material layer, a hole transporting material layer and a hole transporting material layer are arranged in the order described, from lower to upper, or [5] a structure that an electron transporting material layer, an electron transporting material layer, a hole transporting layer and a hole transporting material layer are arranged in the order described, from lower to upper.

In addition, although the materials constituting the photoelectric conversion layer may be any of inorganic materials and organic materials, the invention can fully achieve its effects when organic materials are included therein. Therefore, it is exceedingly preferable to use electron transporting organic materials and hole transporting organic materials as the foregoing electron transporting and hole transporting materials.

As the electron transporting organic materials, acceptor-like organic semiconductors (compounds) can be suitably used. The term "an acceptor-like organic semiconductor (compound)" as used herein is defined as the organic compound having a property of easily accepting an electron, mainly typified by an electron transporting organic compound. More specifically, when two organic compounds are used in a contact state, the organic compound developing a greater affinity for electron than the other is referred to as the acceptor-like organic compound. Therefore, any of organic compounds having electron-accepting properties can be used as acceptor-like organic compounds. Examples of such compounds include fused aromatic carbon-ring compounds (such as naphthalene derivatives, anthracene derivatives, phenanthrene derivatives, tetracene derivatives, pyrene derivatives, perylene derivatives and fluoranthene derivatives), nitrogen-, oxygen- or sulfur-containing 5- to 7-membered hetero-ring compounds (such as pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyraridine, pyrolopyridine, thiadiazolopyridine, dibenzazepin and tribenzazepin), polyarylene compounds, fluorene compounds, cyclopendadiene compounds, silyl compounds, and metal complexes having as ligands nitrogen-containing heterocyclic compounds. Without limiting to the compounds recited above, other organic compounds may also be used as acceptor-like organic semiconductors so far as they have greater affinity for electrons than organic compounds used as donor-like organic compounds.

Examples of an organic compound usable as the hole transporting organic material include poly-N-vinylcarbazole derivatives, polyphenylenevinylene derivative, polyphenylene, polythiophene, polymethylphenylsilane, polyaniline, trizole derivatives, oxadiazole derivatives, imidazole derivatives, polyarylalkane derivatives, pyrazoline derivatives and pyrazolone derivatives, phenylenediamine derivative, arylamine derivatives, amino-substituted chalcone derivatives, oxazole derivatives, carbazole derivatives, styrylanthracene derivatives, fluorenone derivatives, hydrazone derivatives, stilbene derivatives, porphyrin derivatives (such as phthalocyanine), aromatic tertiary amine compounds and styrylamine compounds, butadiene compounds, benzidine derivatives, polystyrene derivatives, triphenylmethane derivatives, tetraphenylbenzidine derivatives and star burst polyamine derivatives.

Further, it is very preferable to use organic dyes. Examples of organic dyes which can be used to advantage include the materials recited above to which light-absorptive structures are added, metal complex dyes, cyanine dyes, merocyanine dyes, phenylxanthene dyes, triphenylmethane dyes, rhodacyanine dyes, xanthene dyes, large ring-shaped azaannulene dyes, azulene dyes, naphthoquinone dyes, anthraquinone dyes, linear compounds condenced with fused polycyclic aromatic ring or heterocyclic compounds, such as anthracene or pyrene, and dyes formed by bonding cyanines via two nitrogen-containing heterocyclic rings (such as quinoline, benzothiazole and benzoxazole), a squalylium group and a croconic methine group.

In the case of metal complex dyes, dithiol metal complex dyes, metal phthalocyanine dyes, metal porphyrin dyes or ruthenium complex dyes, especially ruthenium complex dyes, are used to advantage. Examples of ruthenium complex dyes include the complex dyes disclosed in U.S. Pat. Nos. 4,927,721, 4,684,537, 5,084,365, 5,350,644, 5,463,057 and 5,525,440, JP-A-7-249790, JP-T-10-504512, WO98/50393 and JP-A-2000-26487. And examples of polymethine dyes, such as cyanine dyes, merocyanine dyes and squalylium dyes, include those disclosed in JP-A-11-35836, JP=A-11-67285, JP-A-11-86916, JP-A-11-97725, JP-A-11-158395, JP-A-11-163378, JP-A-11-214730, JP-A-11-214731 JP-A-11-238905, JP-A-2000-26487, and European Patent Nos. 892411, 911841 and 991092.

Additionally, these materials may be incorporated into polymer binders, if needed. Examples of polymer binder used in such a condition include polyvinyl chloride, polycarbonate, polystyrene, polymethyl methacrylate, polybutyl methacrylate, polyester, polysulfone, polyphenylene oxide, polybutadiene, hydrocarbon resin, ketone resin, phenoxy resin, polyamide, ethyl cellulose, polyvinyl acetate, ABS resin, polyurethane, melamine resin, unsaturated polyester, alkyd resin, epoxy resin, silicone resin, polyvinyl butyral, and polyvinyl acetal.

A process of manufacturing a photoelectric conversion layer-stacked solid-state imaging device having the makeup as mentioned above is illustrated by reference to the drawings.

Figure 2:
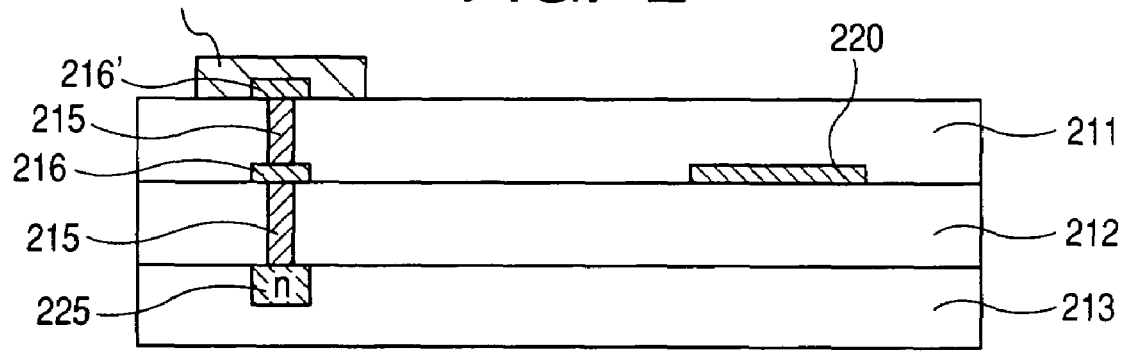
FIG. 2 is a schematic cross-sectional diagram illustrating a process of manufacturing the photoelectric conversion layer-stacked solid-state imaging device shown in FIG. 1.

FIGS. 2 to 12 are schematic cross-sectional diagrams illustrating a process of manufacturing the photoelectric conversion layer-stacked solid-state imaging device shown in FIG. 1. FIG. 2 shows a step of forming constituent members up to the first electrode layer 214, and steps after this step are explained in detail. This is because the step shown in FIG. 2 can be reached in the usual semiconductor process.

Figure 3:
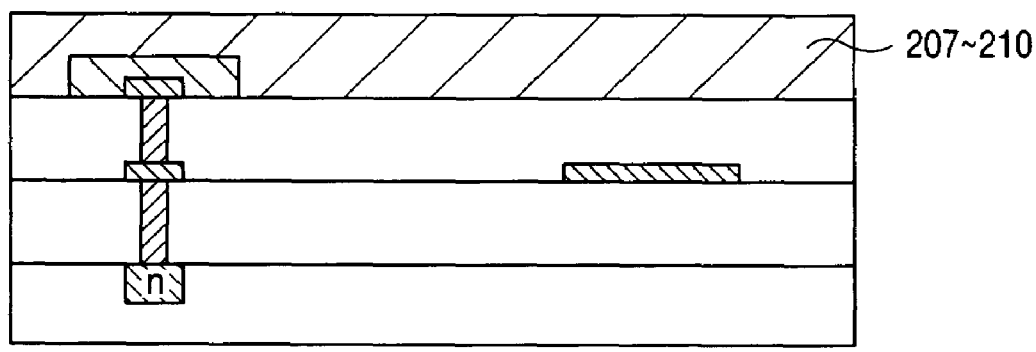
FIG. 3 is a schematic cross-sectional diagram illustrating a process of manufacturing the photoelectric conversion layer-stacked solid-state imaging device shown in FIG. 1.
Figure 4:
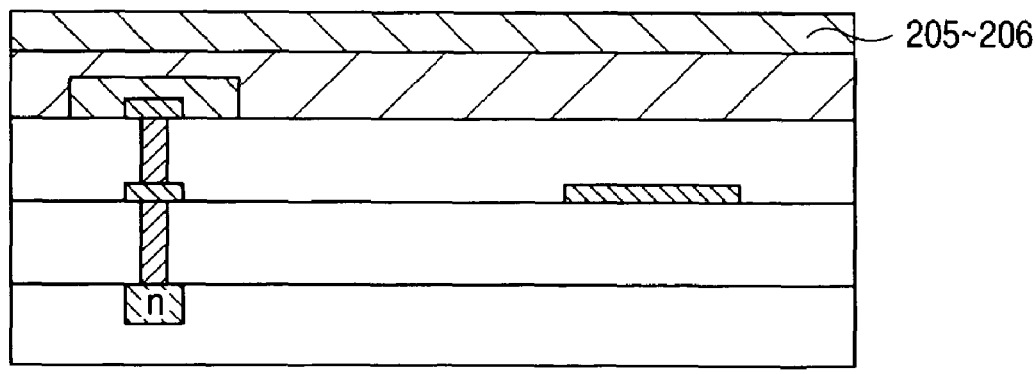
FIG. 4 is a schematic cross-sectional diagram illustrating a process of manufacturing the photoelectric conversion layer-stacked solid-state imaging device shown in FIG. 1.

After forming the first electrode layer 214, the photoelectric conversion layer is formed, as shown in FIG. 3, by providing a hole (positive hole) blocking layer 210, an n-type semiconductor layer 209, a p-type semiconductor layer 208 and an electron blocking layer 207 on the first electrode layer 214 in the order described. Then, as shown in FIG. 4, transparent electrode layers 206 and 205 are provided on the photoelectric conversion layer in the order described, thereby forming the counter electrode layer. Further, as shown in FIG. 5, the photoelectric conversion layer and the counter electrode layer on the peripheral circuit area are removed by selective etching operation.

Figure 6:
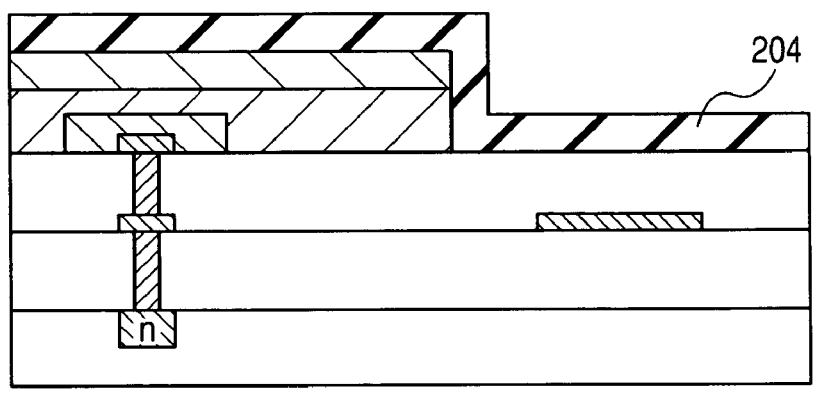
FIG. 6 is a schematic cross-sectional diagram illustrating a process of manufacturing the photoelectric conversion layer-stacked solid-state imaging device shown in FIG. 1.
Figure 7:
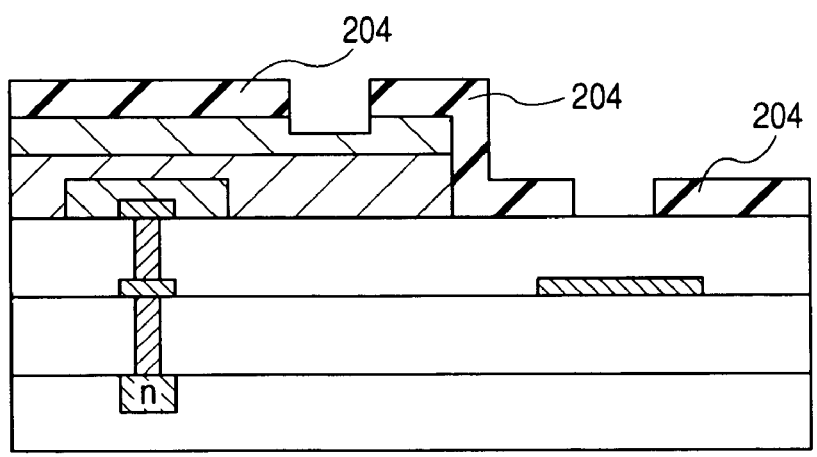
FIG. 7 is a schematic cross-sectional diagram illustrating a process of manufacturing the photoelectric conversion layer-stacked solid-state imaging device shown in FIG. 1.
Figure 8:
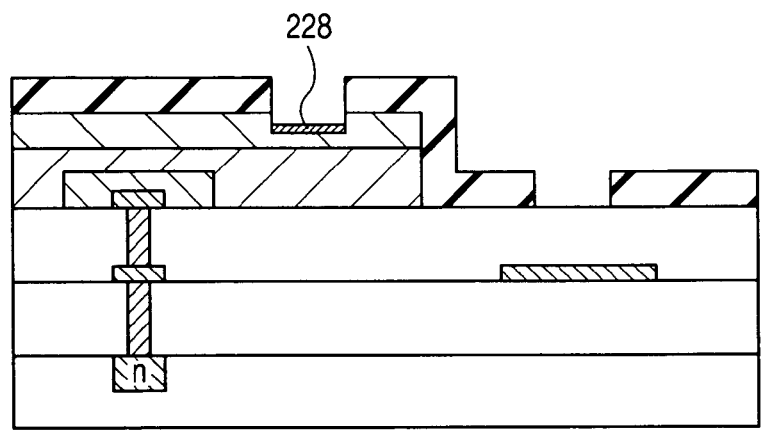
FIG. 8 is a schematic cross-sectional diagram illustrating a process of manufacturing the photoelectric conversion layer-stacked solid-state imaging device shown in FIG. 1.
Figure 9:
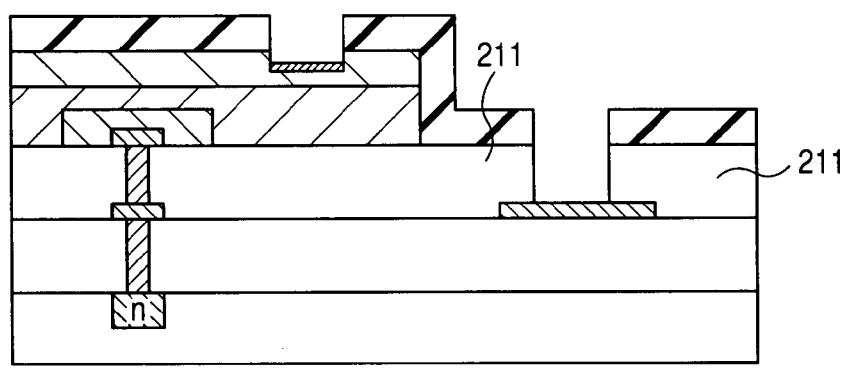
FIG. 9 is a schematic cross-sectional diagram illustrating a process of manufacturing the photoelectric conversion layer-stacked solid-state imaging device shown in FIG. 1.

Furthermore, as shown in FIG. 6, a protective layer 204 is formed. Then, in order that part of the transparent electrode layer 206 as one member of the counter electrode layer is made bare, as shown in FIG. 7, part of the protective layer 204 and part of the counter electrode layer are removed by selective etching. At this time, part of the protective layer 204 above the bonding PAD 220 is also removed by etching. Further, as shown in FIG. 8, barrier metal 228, such as tungsten, is formed into a layer on only the bare surface of the transparent electrode layer 206. Furthermore, as shown in FIG. 9, the insulation layer 211 on the bonding PAD 220 is removed by selective etching so that part of the bonding PAD is made bare.

Figure 10:
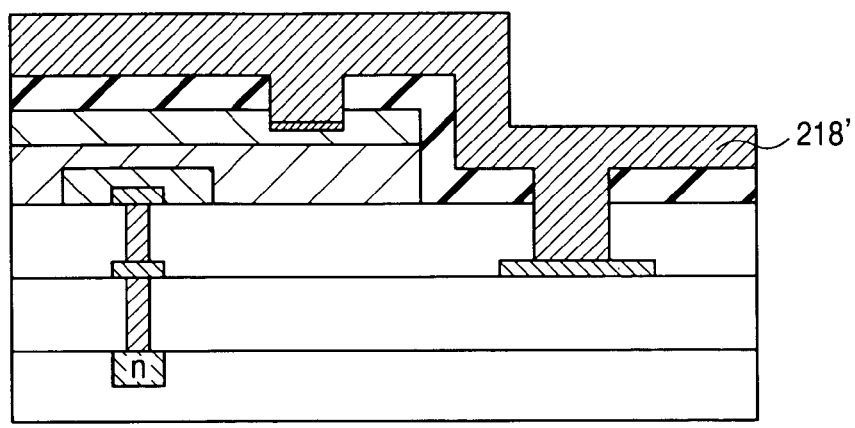
FIG. 10 is a schematic cross-sectional diagram illustrating a process of manufacturing the photoelectric conversion layer-stacked solid-state imaging device shown in FIG. 1.
Figure 11:
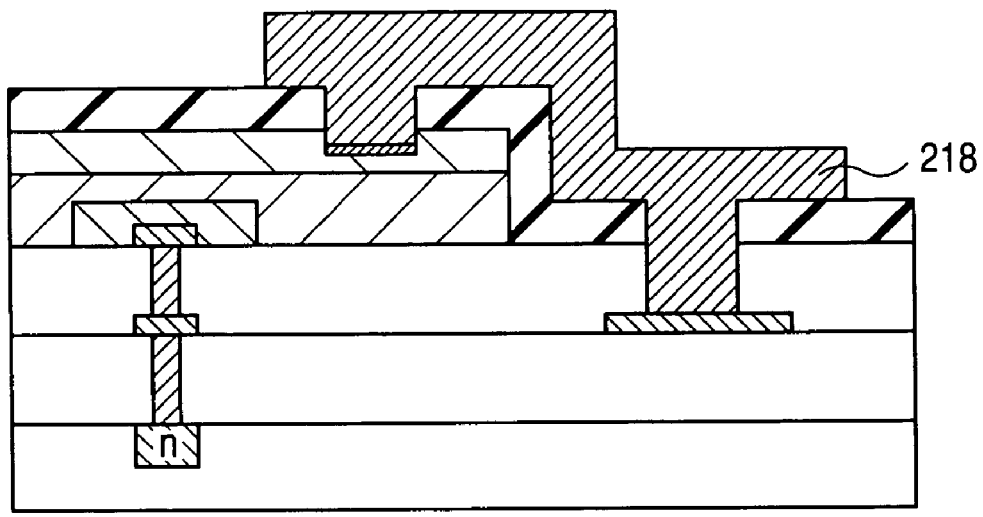
FIG. 11 is a schematic cross-sectional diagram illustrating a process of manufacturing the photoelectric conversion layer-stacked solid-state imaging device shown in FIG. 1.
Figure 12:
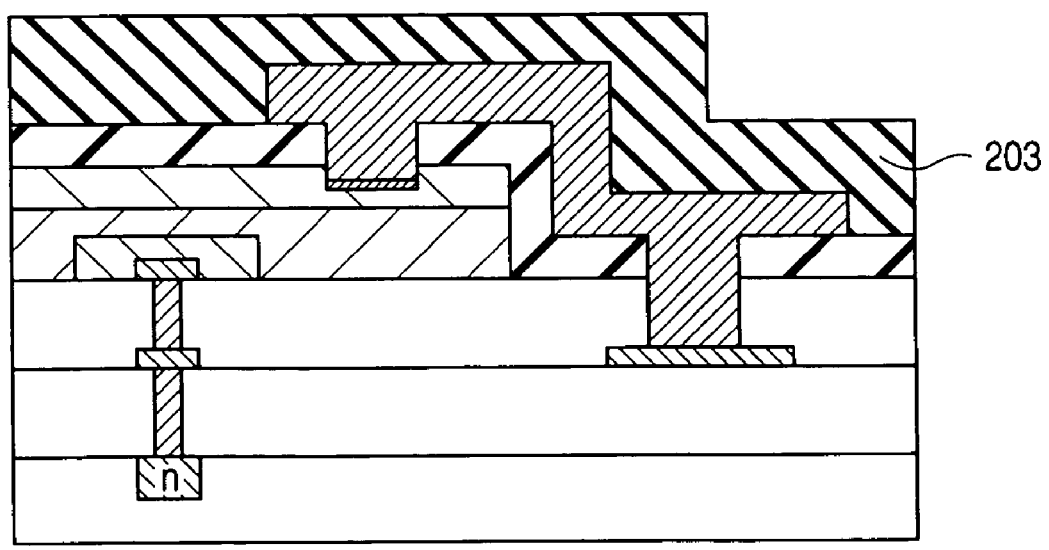
FIG. 12 is a schematic cross-sectional diagram illustrating a process of manufacturing the photoelectric conversion layer-stacked solid-state imaging device shown in FIG. 1.

Next a conductor trace material 218' such as aluminum is formed into a layer as shown in FIG. 10. At this point in time, the conductor trace material 218' becomes embedded in the aperture on the transparent electrode layer 206 and the aperture on the bonding PAD 220, respectively. Then, while keeping a state in which the transparent electrode layer 206 and the bonding PAD 220 are connected together by the conductor trace material 218', nonessential parts of the conductor trace material 218' are removed as shown in FIG. 11 by selective etching to result in formation of the conductor trace 218. Further, a protective layer 203 is formed on the protective layer 204 and the conductor trace 218. And on the protective layer 203 is provided an infrared-cutoff dielectric multilayer layer 202, and further thereon is provided an antireflection layer 201, thereby producing the photoelectric conversion layer-stacked solid-state imaging device shown in FIG. 1.

In accordance with the manufacturing process described above, it becomes possible to form a mask pattern in a condition that the photoelectric conversion layer is protected by the protective insulation layer 204 when the mask pattern is produced for forming the apertures shown in FIG. 7 by photolithography between the steps shown in FIG. 6 and FIG. 7. Therefore, this process has the advantage that deterioration in characteristics of the photoelectric conversion layer can be prevented. Since deterioration in characteristics is feared notably in the case of the photoelectric conversion layer in which an organic material is included, application of this process is highly effective. Such an effect is also produced when a mask pattern is made for formation of the conductor trace 218 at the step shown in FIG. 11.

Additionally, a necessary condition for enabling the protective layer 204 to prevent deterioration in characteristics of the photoelectric conversion layer is in that water permeability of the protective layer 204 is preferably 1 $g/m^2 \cdot day$ or below, far preferably from $1 \times 10^{-9}$ to $1 \times 10^{-2}$ $g/m^2 \cdot day$, farther preferably from $1 \times 10^{-9}$ to $1 \times 10^{-2}$ $g/m^2 \cdot day$, farthest preferably from $1 \times 10^{-9}$ to $1 \times 10^{-4}$ $g/m^2 \cdot day$. The water permeability can be measured with a water permeability measuring apparatus made by, e.g., MOCON, Inc. Although pure water is used for washing treatment in forming a resist pattern by photolithography, the setting of the foregoing condition makes it possible to reliably prevent such pure water from arriving on the photoelectric conversion layer. The protective layer 204 needn't have a single-layer structure, but it may have a multilayer structure made up of a plurality of insulation layers. In the case of the multilayer structure, the protective layer can deliver more enhanced capabilities to the photoelectric conversion layer protection.

Additional formation of barrier metal 228 between the conductor trace 218 and the bonding PAD 220 may be carried out by making an aperture also in the insulation layer 211 on the bonding PAD 220 so that part of the bonding PAD 220 is made bare at the step shown in FIG. 7 and, at the step subsequent thereto, forming the barrier metal 228 into a layer on the bare surface of the bonding PAD 228.

Alternatively, placement of the barrier metal 228 not only between the conductor trace 218 and the transparent electrode layer 206 but also between the conductor trace 218 and the bonding PAD 220 may be carried out by making an aperture also in the insulation layer 211 on the bonding PAD 220 so that part of the bonding PAD 220 is made bare at the step shown in FIG. 7 and, at the step subsequent thereto, applying a layer of the barrier metal 228 all over, further thereon forming the conductor trace material 218' into a layer, and then patterning the barrier metal 228 together with the conductor trace material 218'.

In the photoelectric conversion layer-stacked solid-state imaging device illustrated above, it is especially preferable that the photoelectric conversion layer includes at least a hole transporting organic material and an electron transporting organic material, and besides, it has a structure that the hole transporting organic material and the electron transporting organic material are arranged in layers in the order described, from lower to upper. This is because it has been experimentally demonstrated that the aforementioned structure delivered higher device performance when the photoelectric conversion layer was made up of a hole transporting organic material and an electron transporting organic material.

Second Embodiment

In a second embodiment of the invention, the functional device has a structure that the second electrode layer is divided among pixels and a conductor trace is connected to each piece of the divided second electrode layer via barrier metal. Taking a luminescent device as an example, the second mode of functional device is illustrated below. The luminescent device is a device used in a display or the like. The following illustration is made taking the area emitting light for representing one pixel of an image as one pixel.

Figure 13A:
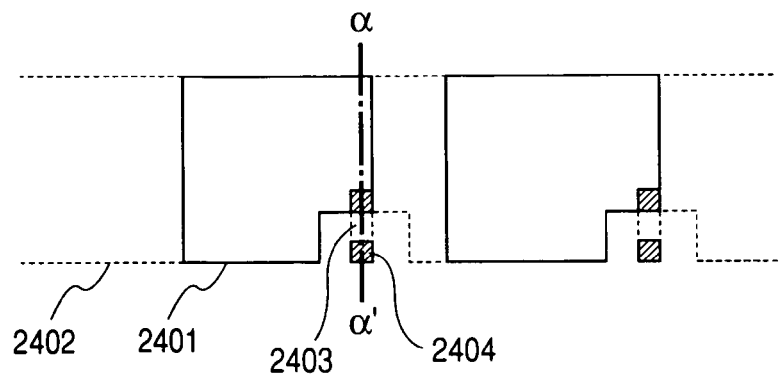
FIG. 13($a$) is a schematic surface view showing a configuration outline of two pixels among those constituting a luminescent device, FIG. 13($b$) is a schematic cross-sectional view taken on line α-α' of FIG. 13($a$), FIG. 13($c$) is a schematic diagram of the drive circuit of the luminescent device in the embodiment of the invention, FIG. 13($d$) is a schematic diagram of a traditional drive circuit.
Figure 13B:
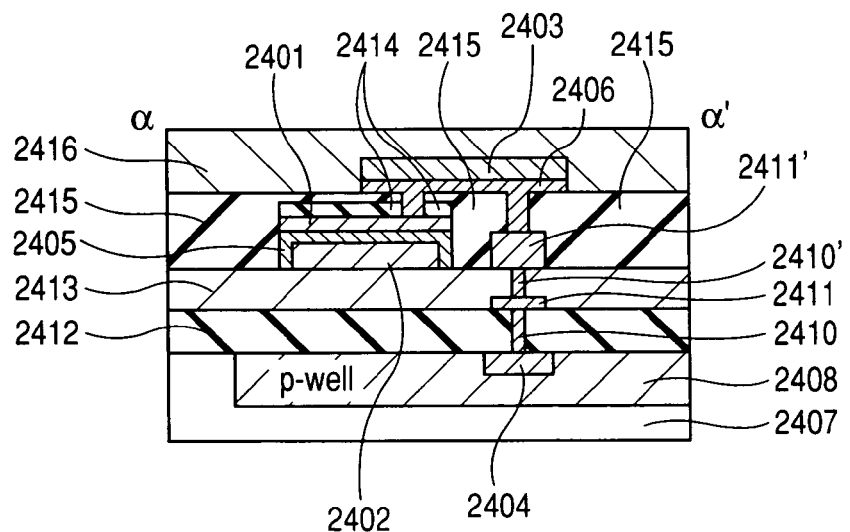
Figure 13C:
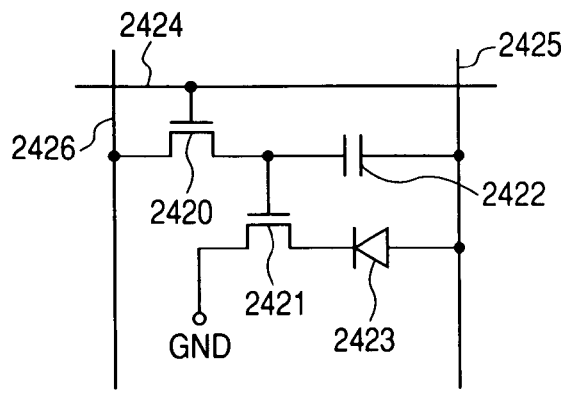
Figure 13D:
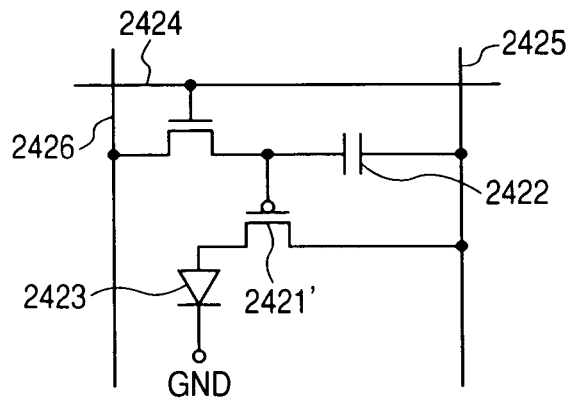

FIG. 13(a) is a schematic surface view showing a configuration outline of two pixels among those constituting the luminescent device, FIG. 13(b) is a schematic cross-sectional view taken on line α-α' of FIG. 13(a), FIG. 13(c) is a diagrammatic drawing showing an example of a driving circuit of the luminescent device, and FIG. 13(d) is a diagrammatic drawing showing a traditional example of the driving circuit of a luminescent device. In FIG. 13(a), the case of sharing the first electrode layer among all pixels is shown. However, the first electrode layer may be divided among pixels.

As shown in FIG. 13(b), a p-well layer 2408 is formed in the surface part of a silicon substrate 2407, and in this layer is formed a drain 2404 of a drive transistor included in the driving circuit. An insulation layer 2412 is formed on the p-well layer 2408, and on the insulation layer 2412 is formed an insulation layer 2413. A plug 2410 is formed in the insulation layer 2412, and that on the drain 2404 of the drive transistor, and the plug 2410 is connected to a an electrode pad 2411 formed in the insulation layer 2413. On the electrode pad 2411 is formed a plug 2410', and the plug 2410' is connected to an electrode pad 2411' formed in an insulation layer 2415. In this way, the electrode pad 2411' is electrically connected to the drain 2404 of the drive transistor.

In the insulation layer 2413 is formed a metal trace (not shown in the drawing) for electrically connecting the electrode pad 2411 to the first electrode layer 2402. In the insulation layer 2415, the first electrode layer 2402, a luminescent layer 2405, a second electrode layer 2401 divided among pixels and a protective insulation layer 2414 are formed in the order described, from lower to upper. Apertures are formed in the insulation layer 2415, and that on part of the second electrode layer and on part of the electrode pad 2411', respectively. And barrier metal 2406 is provided inside the apertures and on the insulation layer 2401. On the barrier metal 2406 is formed a conductor trace 2403 for electrically connecting the second electrode layer 2401 to the electrode pad 2411'. On the conductor trace 2403 is further formed a protective layer 2416 for protecting the conductor trace 2403. In this embodiment of the invention, the area superimposed on the second electrode layer 2401 at the sight of a plan view is defined as a pixel.

As shown in FIG. 13(c), the drive circuit of the luminescent device in the embodiment of the invention is provided with an NMOS transistor 2420, an NMOS transistor 2421 as a drive transistor, a capacitor 2422, a diode 2423, a scanning signal line 2424, a power supply line 2425 and a data signal line 2426. The traditional drive circuit, as shown in FIG. 13(d), uses a PMOS transistor 2421' as a drive transistor. Thus, an NMOS transistor can be used as the drive transistor of a drive circuit when the luminescent device is structured in the embodiment of the invention.

The NMOS transistor is high in mobility because the carrier is an electron, and it is possible to reduce the area thereof by half or so. Since the luminescent device requires a large driving current and the area thereof is liable to become comparatively large, particularly when it contains an organic material, the merit in using the NMOS transistor is more than supposed. Further, in order to allow NMOS and PMOS transistors to coexist in the case of using a single-crystal substrate of Si, either of these transistors is required to be formed on the Well having characteristics opposite to those of the carrier. The formation of such Well imposes a considerable constraint on design rules (For instance, it is required to put a sufficient distance between an Nwell and an NMOS transistor when the Nwell is formed on the PMOS side). These two factors have a critical effect on disparity in performance of a functional device small in pixel area.

The luminescent device shown in FIG. 13 has the structure that the barrier metal 2406 is present between the conductor trace 2403 and the second electrode layer 2401, so the operation durability characteristics thereof can be improved as in the case with the first embodiment of the invention. As the materials for the first electrode layer, the second electrode layer, the barrier metal, the plugs, the conductor trace and the electrode pads which appear in the description of this embodiment of the invention, the materials appearing in the description of the first embodiment of the invention can be used as they are. In the case of using a luminescent layer including an organic material, the invention can fully achieve its effect.

The suitable water permeability of the insulation layer 2415 and that of the protective layer 2414 each is $10 \text{ g/m}^2 \cdot \text{day}$ or below, preferably $1 \text{ g/m}^2 \cdot \text{day}$ or below, far preferably from $1 \times 10^{-9}$ to $1 \times 10^{-2} \text{ g/m}^2 \cdot \text{day}$, farther preferably from $1 \times 10^{-9}$ to $1 \times 10^{-2} \text{ g/m}^2 \cdot \text{day}$, farthest preferably from $1 \times 10^{-9}$ to $1 \times 10^{-4} \text{ g/m}^2 \cdot \text{day}$. In addition, the barrier metal may be provided between the first electrode layer 2402 and the metal trace connected thereto.

In the luminescent device described above, it is preferable that the luminescent layer includes at least a hole transporting organic material and an electron transporting organic material. When the luminescent layer has a structure that the hole transporting organic material and the electron transporting organic material are arranged in layers in the order described, from lower to upper, it becomes particular important to divide the second electrode layer among pixels. In the case of forming the luminescent layer by use of a hole transporting organic material and an electron transporting organic material, it has been experimentally demonstrated that the aforementioned structure delivered higher device performance.

Even when the functional layer in this embodiment of the invention is changed to a photoelectric conversion layer, the aforementioned structure becomes an exceedingly preferred example as it is. More specifically, the device includes the photoelectric conversion layer having the structure that the hole transporting organic material and the electron transporting organic material are arranged in the order described, from lower to upper, and is designed so as to taken out electrons from the second electrode layer to the substrate side. This is because the device whose photoelectric conversion layer has the structure that the hole transporting organic material and the electron transporting organic material are arranged in the order described, from lower to upper, has very excellent photoelectric conversion characteristics, and besides, electrons can be processed as light signal charge inside the substrate.

A process of manufacturing the luminescent device having the makeup as mentioned above is illustrated by reference to the drawings.

Figure 14:
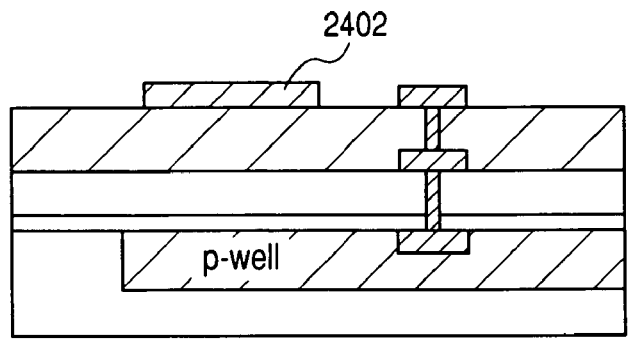
FIG. 14 is a schematic cross-sectional view illustrating a process of manufacturing the luminescent device shown in FIG. 13.

FIGS. 14 to 25 are schematic cross-sectional diagrams illustrating a process of manufacturing the luminescent device shown in FIG. 13. FIG. 14 shows a step of forming constituent members up to the first electrode layer 2402, and steps after this step are explained in detail. This is because the step shown in FIG. 14 can be reached in the usual semiconductor process.

Figure 15:
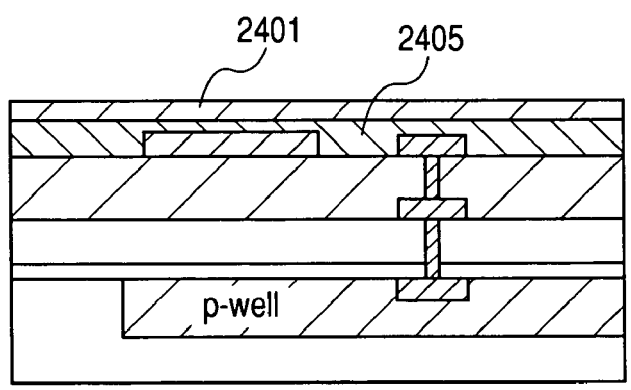
FIG. 15 is a schematic cross-sectional view illustrating a process of manufacturing the luminescent device shown in FIG. 13.
Figure 16:
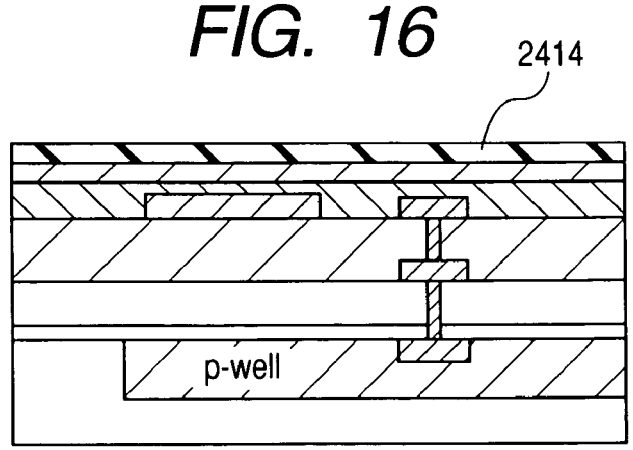
FIG. 16 is a schematic cross-sectional view illustrating a process of manufacturing the luminescent device shown in FIG. 13.
Figure 17:
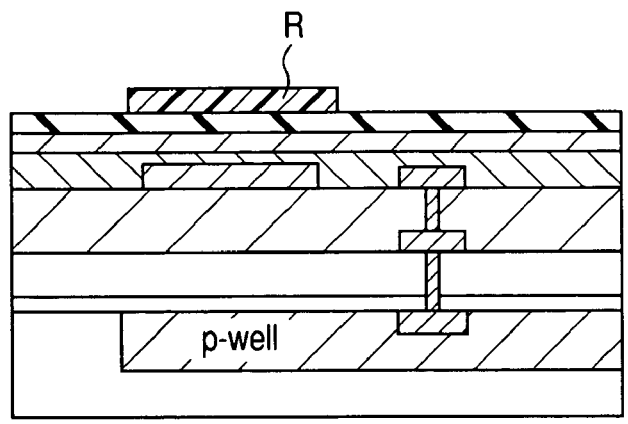
FIG. 17 is a schematic cross-sectional view illustrating a process of manufacturing the luminescent device shown in FIG. 13.

After forming the first electrode layer 2402, as shown in FIG. 15, the luminescent layer 2405 and the second electrode layer 2401 are deposited on the first electrode layer 2402 in the order described. Then, as shown in FIG. 16, the protective layer 2414 for protecting the luminescent layer 2405 is formed on the second electrode layer 2401. Further, as shown in FIG. 17, a proper resist pattern R is formed on the protective layer 2414 in order to divide the luminescent layer 2405 among pixels.

Figure 18:
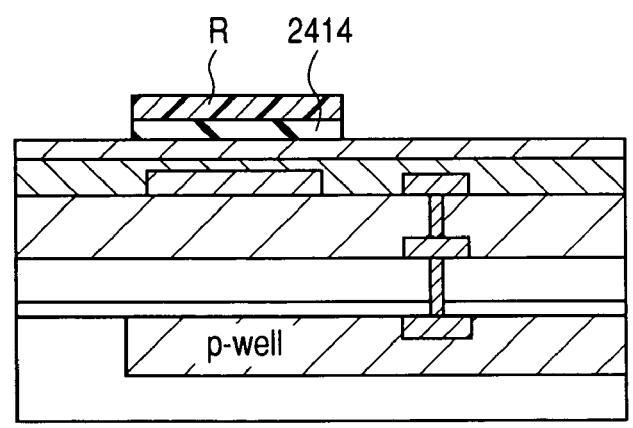
FIG. 18 is a schematic cross-sectional view illustrating a process of manufacturing the luminescent device shown in FIG. 13.
Figure 19:
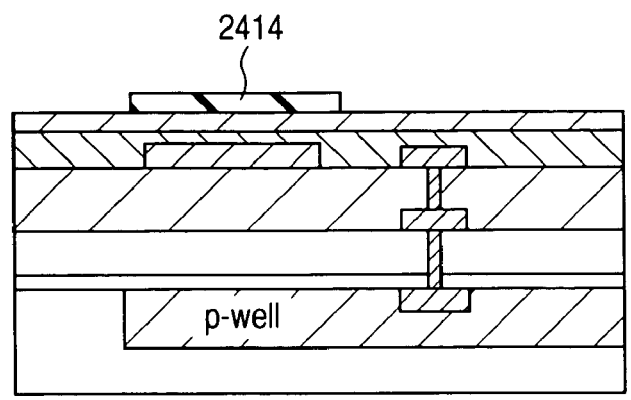
FIG. 19 is a schematic cross-sectional view illustrating a process of manufacturing the luminescent device shown in FIG. 13.
Figure 20:
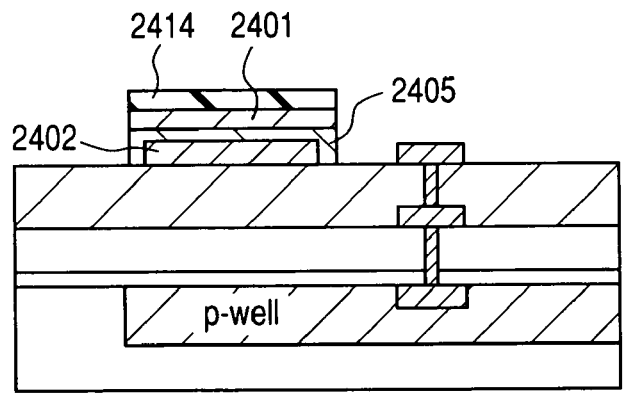
FIG. 20 is a schematic cross-sectional view illustrating a process of manufacturing the luminescent device shown in FIG. 13.
Figure 21:
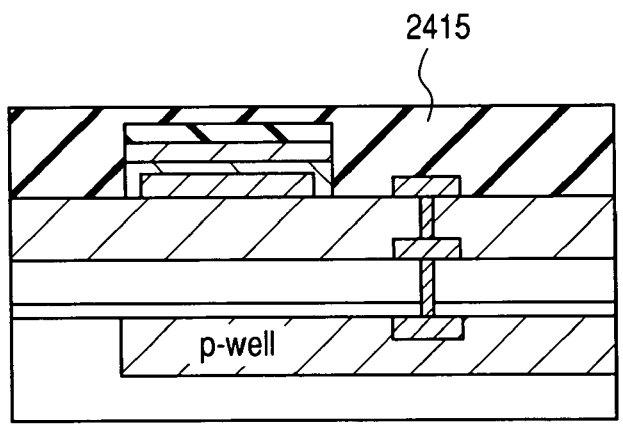
FIG. 21 is a schematic cross-sectional view illustrating a process of manufacturing the luminescent device shown in FIG. 13.
Figure 22:
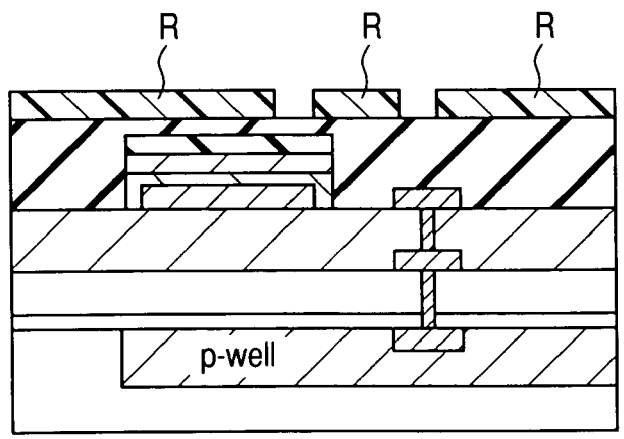
FIG. 22 is a schematic cross-sectional view illustrating a process of manufacturing the luminescent device shown in FIG. 13.
Figure 23:
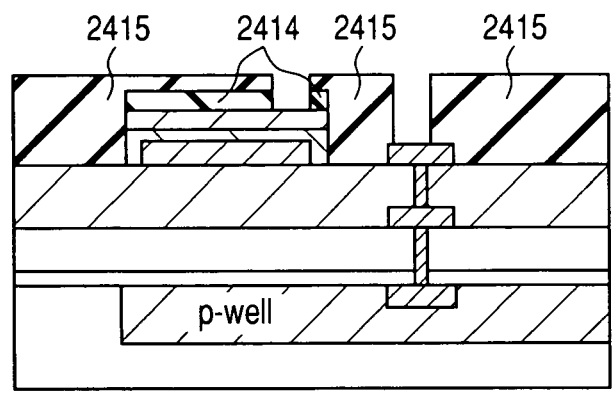
FIG. 23 is a schematic cross-sectional view illustrating a process of manufacturing the luminescent device shown in FIG. 13.

Furthermore, as shown in FIG. 18, the protective layer 2414 is etched using a resist pattern R as mask. Then, the resist pattern is removed as shown in FIG. 19. Further, as shown in FIG. 20, the protective layer 2414 is utilized as mask and the first electrode layer 2402, the luminescent layer 2405 and the second electrode layer 2401 are etched all together. Then, the insulation layer 2415 is applied all over as shown in FIG. 21. Furthermore, as shown in FIG. 22, the resist pattern R is made on the insulation layer 2415. Then, the insulation layer 2415 and the protective layer 2415 are etched by using the resist pattern R as mask to result in formation of apertures on part of the second electrode layer 2401 and on part of the electrode pad 2411' as shown in FIG. 23.

Figure 24:
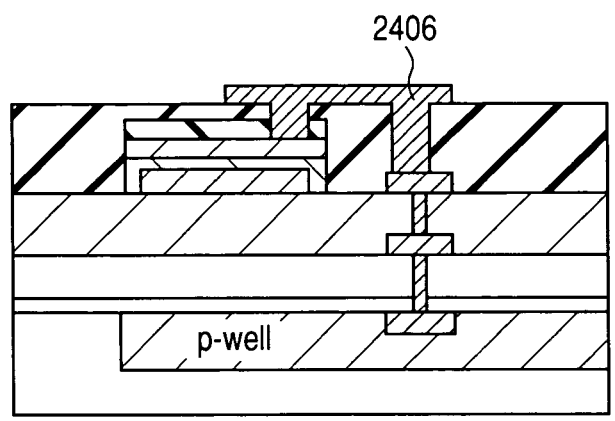
FIG. 24 is a schematic cross-sectional view illustrating a process of manufacturing the luminescent device shown in FIG. 13.
Figure 25:
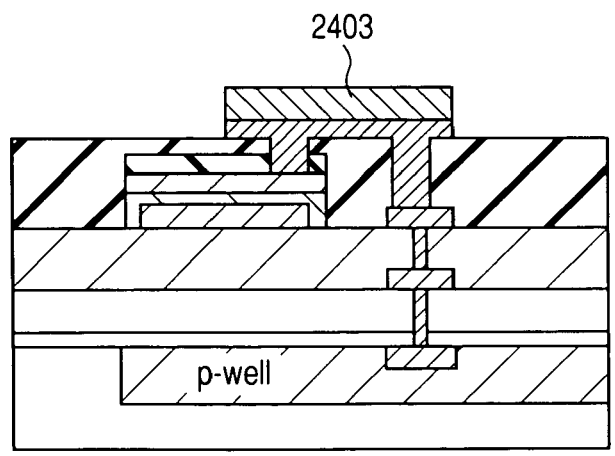
FIG. 25 is a schematic cross-sectional view illustrating a process of manufacturing the luminescent device shown in FIG. 13.

Next the barrier metal 2406 is applied all over and then subjected to patterning so that only the segment for connecting the second electrode layer 2401 to the electrode pad 2411' is left as shown in FIG. 24. At this point in time, the barrier metal 2406 becomes embedded in the aperture on the second electrode layer 2401 and in the aperture on the electrode pad 2411'. Then, a conductor trace material is formed into a layer, and patterned so that the conductor trace material is left only on the barrier metal 2406, thereby forming the conductor trace 2403 as shown in FIG. 25. Finally, a protective layer 2416 is formed on the conductor trace 2403, thereby producing the luminescent device as shown in FIG. 13. Alternatively, patterning for the conductor trace 2403 and that for the barrier metal 2406 may be performed simultaneously.

In accordance with the manufacturing process described above, the barrier metal 2406 and the conductor trace 2403 can be formed by patterning in a condition that two insulation layers, namely the protective layer 2414 and the insulation layer 2415, are present on the luminescent layer. In the photolithographic step of forming the barrier metal 2406 and the conductor trace 2403, therefore, damages to the luminescent layer 2405, particularly from resulting from permeation of water in the washing step, can be minimized by the presence of the two insulation layers, namely the insulation layers 2414 and 2415, and deterioration in characteristics of the luminescent layer can be prevented. Moreover, the luminescent device shown in FIG. 13 is provided with a contact spot for connecting the second electrode layer 2401 to the conductor trace 2403 for each pixel. Therefore, this makeup can produce an effect that the luminous area can be made larger the smaller the contact spot is in size. Additionally, the structure having the divided second electrode layer as in this embodiment of the invention can also be applied to a triple-layered structure as shown in the following example.

Third Embodiment

A third embodiment of the invention is illustrated with taking as an example of the structure of a photoelectric conversion layer-stacked solid-state imaging device the first structure that permits color imaging by depositing above a silicon substrate three photoelectric conversion layers, each of which is made up of two electrode layers and an organic material sandwiched between them, and detecting lights of three different colors above the silicon substrate.

Figure 26:
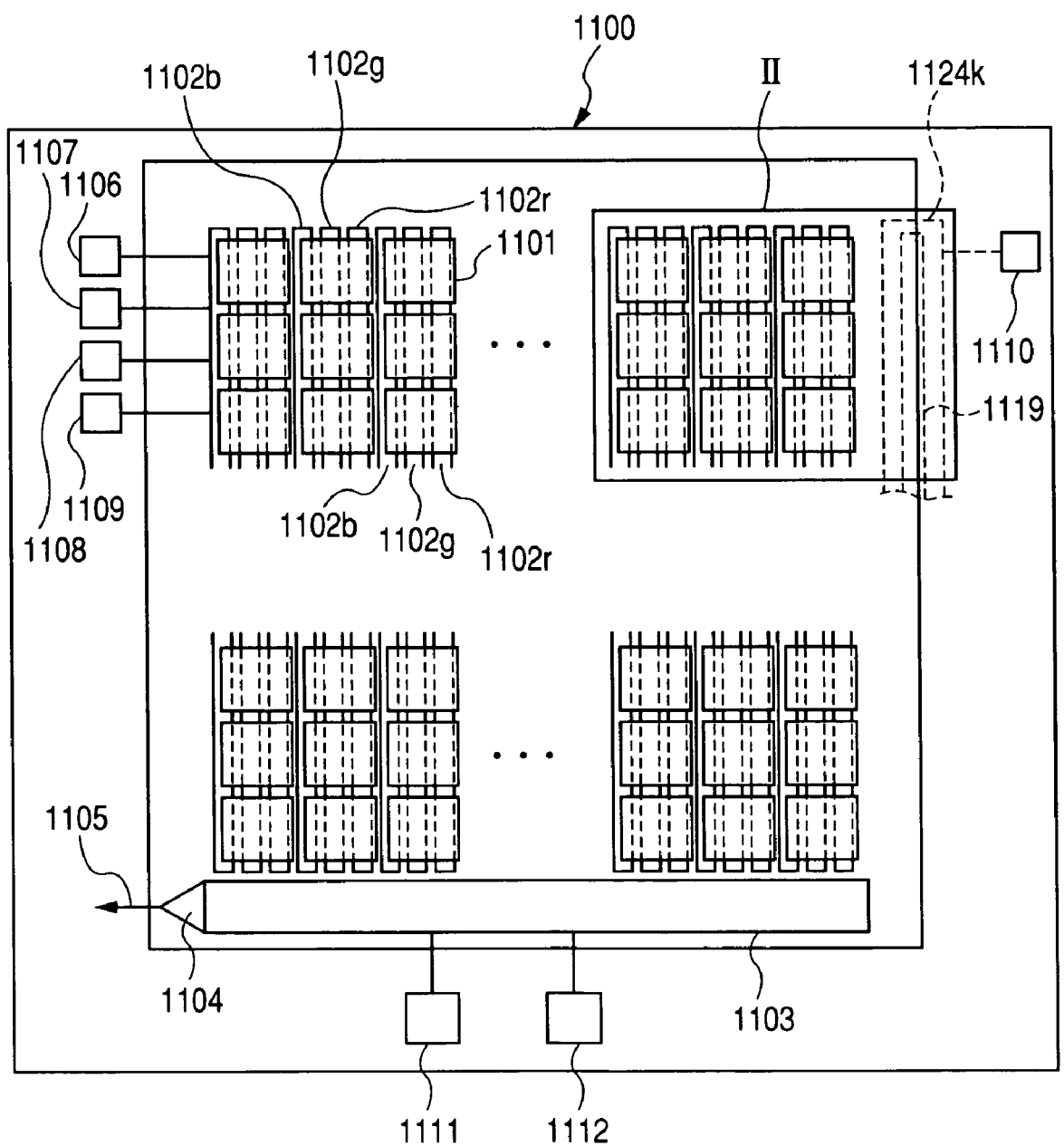
FIG. 26 is a schematic surface view of a photoelectric conversion layer-stacked solid-state imaging device for illustrating a third embodiment of the invention.

FIG. 26 is a schematic surface view of a photoelectric conversion layer-stacked solid-state imaging device for illustrating the third embodiment of the invention. The photoelectric conversion layer-stacked solid-state imaging device 1100 shown in FIG. 26 has a great many light-receiving portions (pixels) 1101 arrayed in a grid pattern, or a matrix of pixels, in this example.

On the surface of a semiconductor substrate provided underneath the light-receiving portions 1101 in the photoelectric conversion layer-stacked solid-state imaging device 1100, three vertical transfer lines (column-wise CCD resistor) 1102$b$, 1102$g$ and 1102$r$ (suffixes b, g and r correspond to blue (B), green (G) and red (R), respectively, and these relations are the same hereinafter also) are formed in response to each of the columns of light-receiving portions 1101 aligned in a column-wise direction. And in the lower hem region is formed a horizontal transfer line (row-wise CCD resistor) 1103.

In addition, an amplifier 1104 is provided in the outlet portion of the horizontal transfer line 1103. Signal charges detected in each light-receiving portion 1101 are transferred firstly to the horizontal transfer line 1103 through the vertical transfer lines 1102$b$, 1102$g$ and 1102$r$, and then to the amplifier 1104 through the horizontal transfer line 1103, and further output as output signals from the amplifier 1104.

On the surface of the semiconductor substrate are provided electrode terminals 1106, 1107, 1108 and 1109 connected to 4-phase transfer electrodes which are placed in a state of being superposed on the vertical transfer lines 1102$b$, 1102$g$ and 1102$r$ though they are not shown in the diagram, to which 4-phase transfer pulses are applied, an electrode terminal 1110 connected to the second electrode layer described hereinafter, and 2-phase transfer electrode terminals 1111 and 1112 for the horizontal transfer line 1103.

FIG. 27($a$) is an enlarged schematic view of the interior of a rectangular region II enclosed with dotted lines in FIG. 26, and therein 9 pixels of light-receiving portions 1101 and part of a vertical conductor trace 1119 to which the electrode terminal 1110 is connected are shown diagrammatically. Incidentally, the vertical transfer lines 1102$r$, 1102$g$ and 1102$b$ shown in FIG. 26 are omitted in FIG. 27($a$).

Each light-receiving portion 1101 is demarcated with the aid of a rectangular first electrode layer 1120 (also referred to as a pixel electrode layer because it is divided among pixels). The first electrode layer 1120 shown in FIG. 27($a$) is, as shown in FIG. 27($b$), made up of three sheets of first electrode layers 1120$r$, 1120$g$ and 1120$b$ aligned in an incident-light direction via the following photoelectric conversion layers or the like.

The first electrode layer 1120$r$ for red color has in the same plane a protruding pad 1117$r$ for connection with a longitudinal conductor trace. Likewise, the first electrode layer 1120$g$ for green color has in the same plane a protruding pad 1117$g$ for connection with a longitudinal conductor trace, and similarly thereto the first electrode layer 1120$b$ for blue color has in the same plane a protruding pad 1117$b$ for connection with a longitudinal conductor trace. These protruding pads 1117$r$, 1117$g$ and 1117$b$ of the same pixel (light-receiving portion) 1101 are attached in positions displaced from one another as shown in FIG. 27($a$).

Figure 27A:
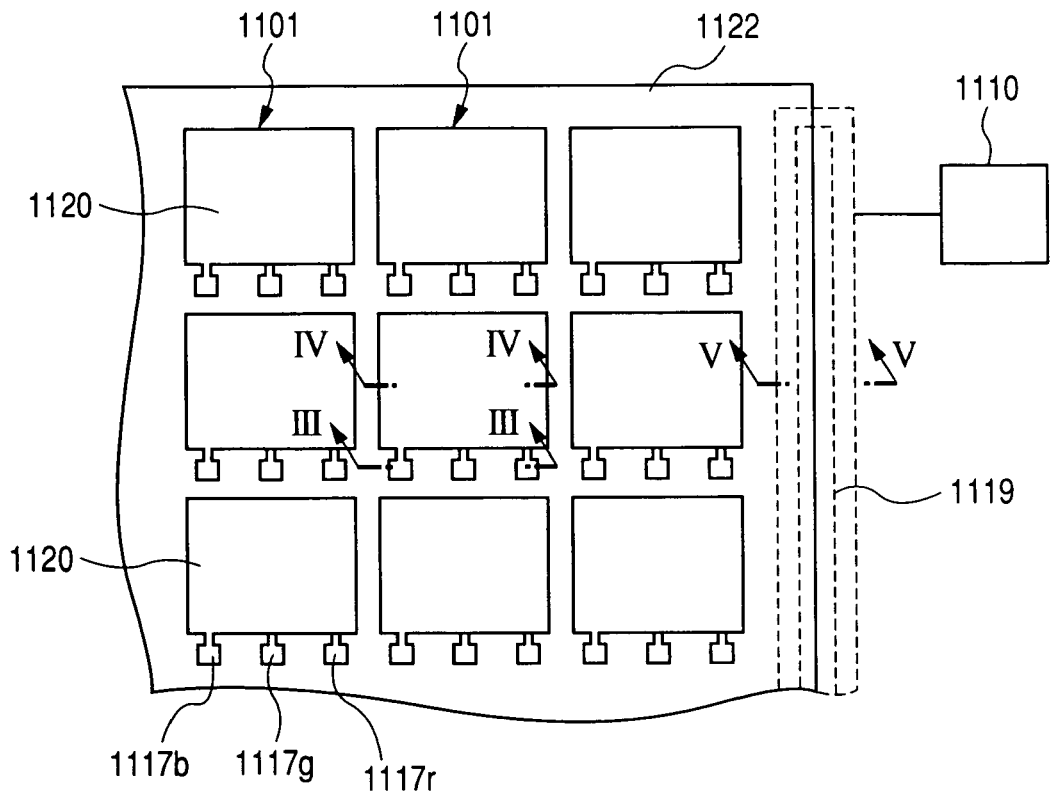
FIG. 27($a$) is an enlarged schematic view of the interior of a rectangular region II enclosed with dotted lines in FIG. 26, and FIG. 27($b$) is a disassemble view of the first electrode layer of a light-receiving portion.
Figure 27B:
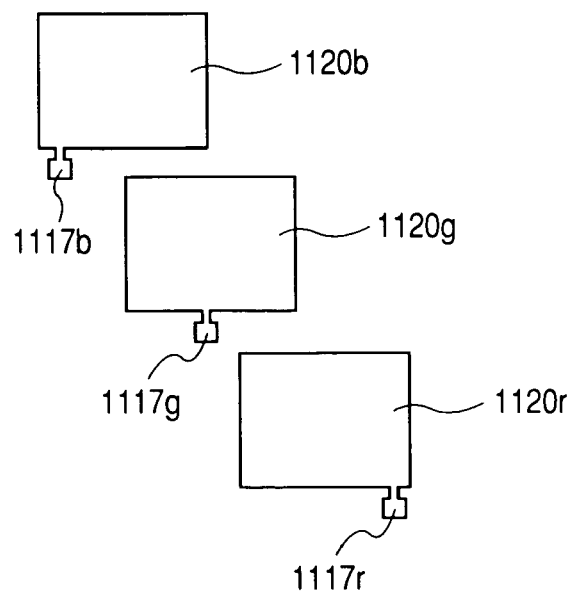
Figure 28:
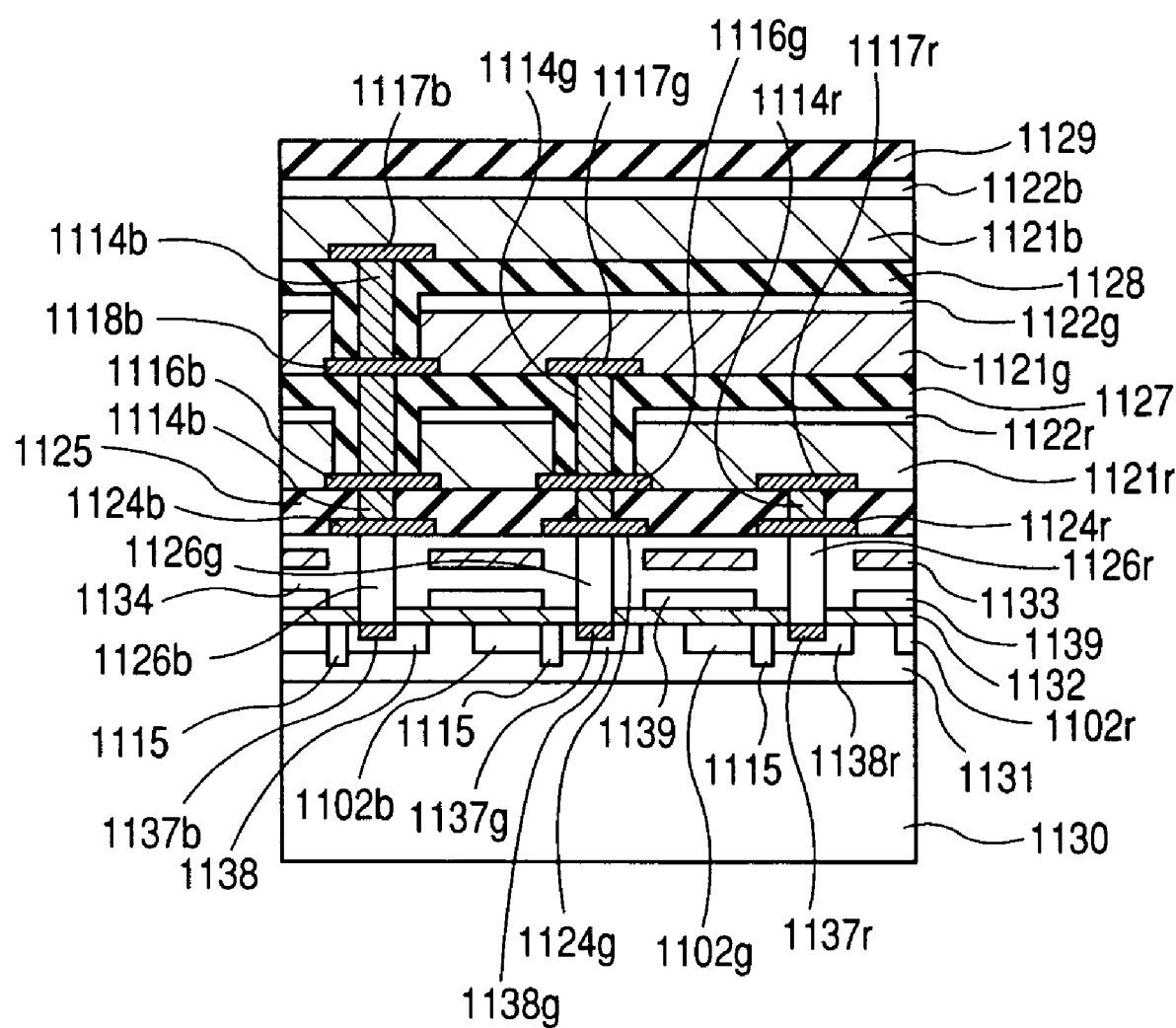
FIG. 28 is a schematic cross-sectional view taken on line III-III of FIG. 27($a$).
Figure 29:
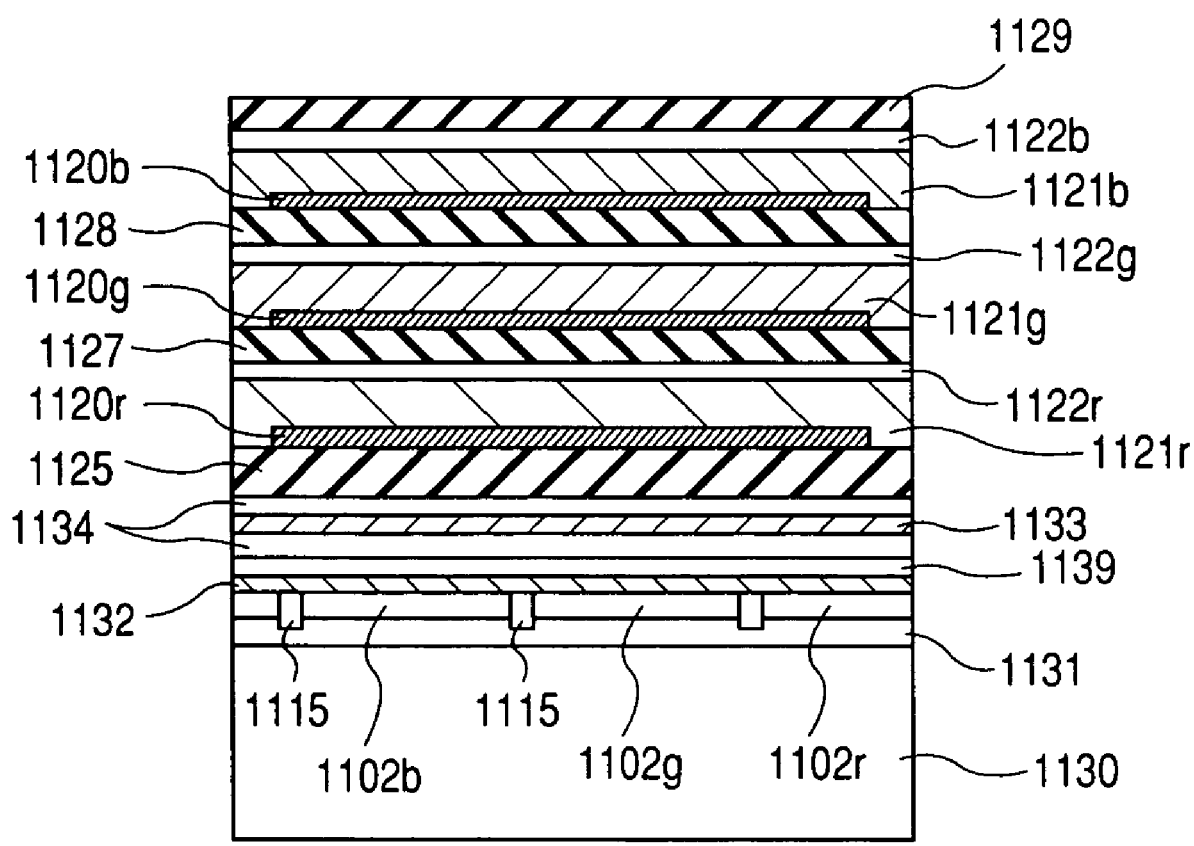
FIG. 29 is a schematic cross-sectional view taken on line IV-IV of FIG. 27($a$).

FIG. 28 is a schematic cross-sectional view taken on line III-III of FIG. 27($a$), and therein are shown sections of the pad 1117$r$, 1117$g$ and 1117$b$ portions. FIG. 29 is a schematic cross-sectional view taken on line IV-IV of FIG. 27($a$), and therein is shown a section of the central portion of each pixel.

A P-well layer 1131 is formed on the surface area of an n-type semiconductor substrate 1130. On the surface area of the P-well layer 1131, charge accumulation portions 1138$r$, 1138$g$ and 1138$b$ made up of n-type zones are formed, and besides, vertical transfer lines (n-type semiconductor layers) 1102r, 1102g and 1102b demarcated by channel stops 1115 are formed. In the central part of each of the charge accumulation portions 1138r, 1138g and 1138b, longitudinal conductor trace connection spots 1137r, 1137g and 1137b made up of n+ zones are formed.

A gate insulation layer 1132 is formed on the surface of the semiconductor substrate 1130, and thereon a transfer electrode 1139 made up of polycrystalline silicon is formed. Further thereon is formed an insulation layer 1134, and a light shielding layer 1133 is formed inside the insulation layer 1134 to prevent incident light from entering into the vertical transfer lines.

A conductive layer is formed on the insulation layer 1134, and subjected to patterning. Thus, lateral conductor traces 11244, 1124g and 1124b are formed as shown in FIG. 28. The longitudinal conductor trace connection spots 1137r, 1137g and 1138b of the charge accumulation portions 1138r, 1138g and 1138b and the lateral conductor traces 1124r, 1124g and 1124b are connected by a first longitudinal conductor traces 1126r, 1126g and 1126b.

An insulation layer is formed in the upper part of the layer provided with the lateral conductor traces 1124r, 1124g and 1124b, and thereon a transparent conductive layer is deposited. The transparent conductive layer is subjected to patterning and thereby the first electrode layer 1120r divided among light-receiving portions 1101 is formed. By this patterning, the pad 1117r shown in FIG. 27(b) is further formed, and besides, conductive layers 1116b and 1116g separated from others and aligned to the pads 1117b and 1117 g in the incident direction of light are left.

On the upper part of these first electrode layers 1120r, pad 1117r and conductive layers 1116 and 1116g, a photoelectric conversion layer 1121r for detection of red color (R) is deposited. This photoelectric conversion layer 1121r needn't be provided in a state of being divided among light-receiving portions, but it is applied in a single-sheet form all over the light-receiving area wherein light-receiving portions 1101 congregate.

On the photoelectric conversion layer 1121r, a second electrode layer 1122r shared with red signal detecting light-receiving portions 1101 (which is opposed to the first electrode layer, so also referred to as "counter electrode layer") is applied in a single-sheet form, too. On the second electrode layer, a transparent insulation layer 1127 is deposited.

In the upper part of the insulation layer 1127, a transparent conductive layer is applied. This conductive layer is subjected to patterning and, as in the foregoing case, the first electrode layer 1120g divided among light-receiving portions 1101, the pad 1117g and the conductive layer 1118b separated from others and aligned to the pad 1117b shown in FIG. 27(b) are formed. On the first electrode layer 1120g and the others, a photoelectric conversion layer 1121g for detection of green color (G) is deposited in a single-sheet form in the similar way to the above. Further, a second electrode layer 1122g is applied in the upper part of the layer 1121g, and furthermore a transparent insulation layer 1128 is deposited on the electrode layer 1122g.

In the upper part of the insulation layer 1128, a transparent conductive layer is applied, and subjected to patterning, thereby forming a first electrode layer 1120b divided among light-receiving portions 1101 and a pad 1117b. And there on a photoelectric conversion layer 1121b for detection of blue color (B) is deposited in a single-sheet form in the same way as mentioned above. In the upper part of the photoelectric conversion layer 1121b, a second electrode layer 1122b is further applied, and thereon a protective layer 1129 as the topmost layer is deposited.

The lateral conductor trace 1124b and the pad 1117b of the first electrode layer 1120b for blue color are connected with the second longitudinal conductor trace 1114b, the lateral conductor trace 1124g and the pad 1117g of the first electrode layer 1120g for green color are connected with the second longitudinal conductor trace 1114g, and the lateral conductor trace 1124r and the pad 1117r of the first electrode layer 1120r for red color are connected with the second longitudinal conductor trace 1114r. The longitudinal conductor traces 1114r, 1114g, 1114b, 1126r, 1126g and 1126b are produced in a state of being electrically insulated from the corresponding first electrode layer pads, conductive layers 1116g, 1116b and 1118b, and members other than the lateral conductor traces as described below in detail.

Figure 30:
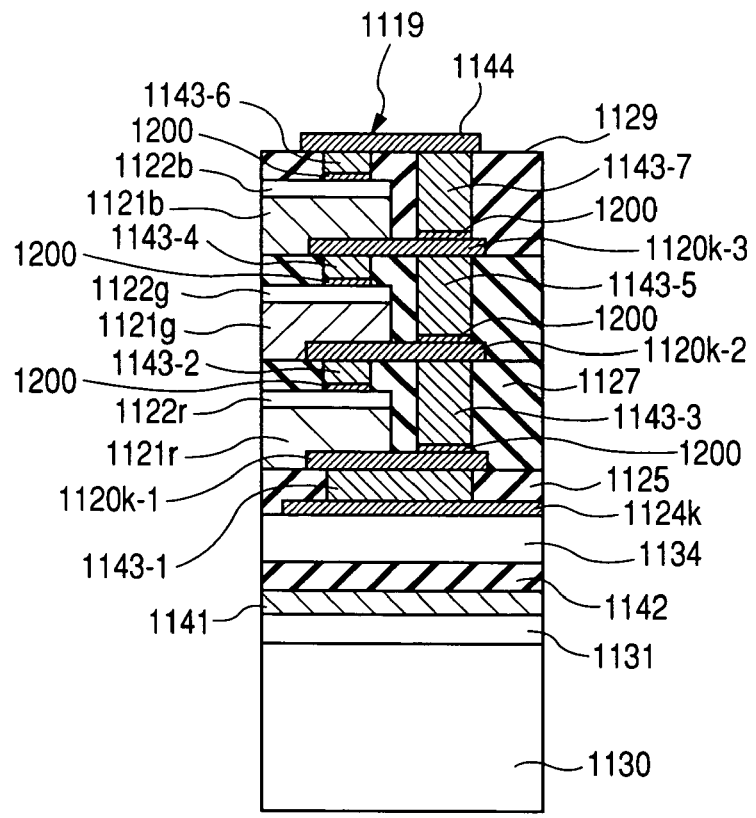
FIG. 30 is a schematic cross-sectional view taken on line V-V of FIG. 27($a$).

FIG. 30 is a schematic cross-sectional view taken on line V-V of FIG. 27(a) and shows a structure of connection between the electrode terminal 1110 and each of the second electrode layers 1122b, 1122g and 1122r. On the surface area of the P-well layer 1131 formed on the surface area of then-type semiconductor substrate 1130, a high-concentration P layer 1141 is formed, and further thereon a field zone (insulation layer) 1142 is formed.

The high-concentration P layer 1141 may be formed in the same process as the channel stop 1115 shown in FIGS. 28 and 29, or it may be formed in another process. The insulation layer 1142 is formed at the same time as the gate insulation layer 1132 shown in FIGS. 28 and 29, and besides, the insulation layer formation process is further continued after the formation of the gate insulation layer 1132 so that the insulation layer 1142 has greater thickness than the gate insulation layer 1132.

On the insulation layer 1142, the same insulation layer 1134 as in FIGS. 28 and 29, and thereon a conductive layer 1124k is deposited. This conductive layer 1124k is formed in the process of patterning the conductive layer forming the lateral conductor traces 1124r, 1124g and 1124b shown in FIGS. 28 and 29, and the electrode terminal 1110 shown in FIG. 26 is connected to this conductive layer 1124k.

The conductive layer forming the first electrode layer 1120r is subjected to patterning to form a conductive layer 1120k-1, and a longitudinal conductor trace 1143-1 is formed between the conductive layer 1124k and the conductive layer 1120k-1.

Likewise, the conductive layer forming the first electrode layer 1120g is subjected to patterning to form not only a conductive layer 1120k-2 but also a longitudinal conductor trace 1143-2 between the second electrode layer 1124r and the conductive layer 1120k-2, and at the same time to form a longitudinal conductor trace 1143-3 between the conductive layer 1120k-2 and the conductive layer 1120k-1. As a result, the second electrode layer 1122r and the conductive layer 1124k are electrically connected, and the second electrode layer 1122r is connected to the electrode terminal 1110.

Likewise, the conductive layer forming the first electrode layer 1120b is subjected to patterning to form a conductive layer 1120k-3, the longitudinal conductor trace 1143-4 is formed between the second electrode layer 1122g and the conductive layer 1120k-3, and besides, the longitudinal conductor trace 1143-5 is formed between the conductive layer 1120k and the conductive layer 1120k-2. Thus, the second electrode layer 1122g and the conductive layer 1124k are connected electrically, and the second electrode layer 1122g is connected to the electrode terminal 1110.

In the corner of the top surface of the protective layer 1129, a transparent conductive layer 1144 is applied, a longitudinal conductor trace 1143-6 is formed between the second electrode layer 1122 band the conductive layer 1144, and besides, a longitudinal conductor trace 11143-7 is formed between the conductive layer 1144 and the conductive layer 1120k-3. As a result, the second electrode layer 1122b and the conductive layer 1124k are connected electrically, and the second electrode layer 1122b is connected to the electrode terminal 1110.

The photoelectric conversion layer-stacked solid-state imaging device in this embodiment of the invention features the presence of barrier metal 1200 between two different electrodes as shown in FIG. 30, such as between the second electrode layer 1122r and the longitudinal conductor trace 1143-2, between the second layer 1122g and the longitudinal conductor trace 1143-4, between the second electrode layer 1122b and the longitudinal conductor trace 1143-6, between the conductive layer 1120k-1 and the longitudinal conductor trace 1143-3, between the conductive layer 1120k-2 and the longitudinal conductor trace 1143-5, and between the conductive layer 1120k-3 and the longitudinal conductor trace 1143-7. By such a structure, operation durability characteristics can be improved. Materials used for the second electrode layers and the barrier metal may be the same as in the first embodiment of the invention. Incidentally, the barrier metal may be present in at least one of the positions recited above.

As homogeneous transparent electrode layers 1122r, 1122g, 1122b, 1120r, 1120g and 1120b, thin layer of tin oxide ($SnO_2$), titanium oxide ($TiO_2$), indium oxide ($InO_2$) or indium tin oxide (ITO) is used. However, usable layers should not be construed as being limited to those recited above.

The photoelectric conversion layers 1121r, 1121g and 1121b may be monolayer layers or multilayer layers. Examples of a material for such layer include inorganic materials such as silicon and compound semiconductors, organic materials such as organic semiconductors and organic dyes, and quantum dot deposition layers made up of nanoscale particles. The suitable makeup includes those described in the first embodiment of the invention.

In this embodiment of the invention is taken such a structure that two or more photoelectric conversion layers are deposited on a silicon substrate. In the case of depositing two photoelectric conversion layers on a silicon substrate, for example, each photoelectric conversion layer may have any of the structure examples [1], [2], [3], [4] and [5] recited in the description of the first embodiment of the invention, and the other photoelectric conversion layer used in combination therewith may have any of [1], [2], [3], [4], [5] and other structures. Since the deposition of two or more photoelectric conversion layers on a silicon substrate enhances the availability of light per unit area, compared with only one photoelectric conversion layer, such multilayer structures are preferred in the invention and may be included in makeup requirements. Additionally, the deposition of three or more photoelectric conversion layers on a silicon substrate in this embodiment of the invention can further enhance the availability of light, so it is particularly advantageous to the invention. This case in particular makes it possible to provide a blue photoelectric conversion layer, a green photoelectric conversion layer and a red photoelectric conversion layer, and enables the production of a full-color imaging device. So, such makeup is strongly preferred in the invention. Naturally enough, examples of a makeup adoptable in the case of depositing three or more photoelectric conversion layers in combination include, as with the case of depositing two photoelectric conversion layers, combinations of any three or more structures chosen from among the structure examples [1], [2], [3], [4] and [5], and combinations of at least any one or more structures chosen from among the structure examples [1], [2], [3], [4] and [5] with any other structures. Of course, other combinations may also be adopted.

When light from a subject strikes the surface of a photoelectric conversion layer-stacked solid-state imaging device with the makeup as recited above, photo-charge in an amount responsive to the quantity of blue rays of the incident light is generated in the blue photoelectric conversion layer 1121b, and the photo-charge generated herein is conveyed by the longitudinal conductor trace 1114b, the lateral conductor trace 1124b and the longitudinal conductor trace, and accumulated in the charge accumulation zone 1138b. Similarly to the above, the photo-charge in an amount responsive to the quantity of green rays of the incident light is accumulated in the charge accumulation zone 1138g, and the photo-charge in an amount responsive to the quantity of red rays of the incident light is accumulated in the charge accumulation zone 1138r. The charges (signal charges) accumulated in the charge accumulation zones 1138r, 1138g and 1138b, respectively, are read out to the vertical transfer lines 1102r, 1102g and 1102b, transferred to the horizontal transfer line 1103, transmitted along the horizontal transfer line 1103, and output from the photoelectric conversion layer-stacked solid-state imaging device 1100.

FIGS. 31 to 46 show diagrams illustrating a procedure of manufacturing the photoelectric conversion layer-stacked solid-state imaging device shown in FIG. 28 to FIG. 30. Each figure to which (a) is appended is a schematic cross-sectional view taken on the same line as in FIG. 28, and each figure to which (b) is appended is a schematic cross-sectional view taken on the same line as in FIG. 30. FIG. 46(a) showing the state in which the manufacturing process is completed is the same as FIG. 28, and FIG. 46(b) is the same as FIG. 30.

Figure 31A:
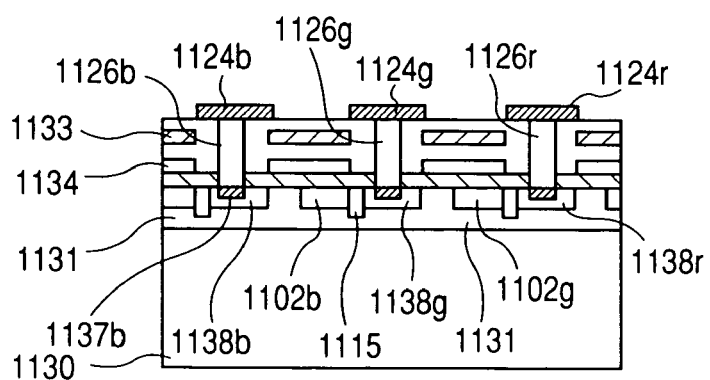
FIGS. 31A and 31B show diagrams illustrating a procedure of manufacturing the photoelectric conversion layer-stacked solid-state imaging device shown in FIG. 28 to FIG. 30.
Figure 31B:
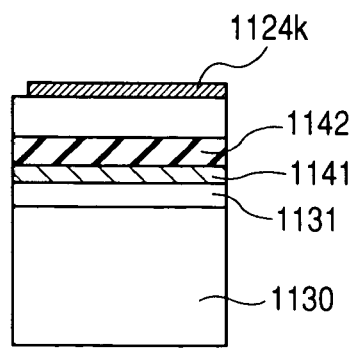

The procedure up to the step shown in FIG. 31 is the same as in traditional semiconductor manufacturing processes for CCD and CMOS imaging devices. More specifically, the charge accumulation zones 1138r, 1138g and 1138b and the vertical transfer lines 1102r, 1102g and 1102b are formed within the P-well layer on the semiconductor substrate 1130, and the insulation layer 1134 is formed on the surface area of the P-well layer. In the insulation layer 1134, apertures for first longitudinal conductor traces 1126r, 1126g and 1126b are formed by etching, and filled up with metal, such as tungsten or copper, or polycrystalline silicon having conductivity, thereby forming the first longitudinal conductor traces 1126r, 1126g and 1126b. On the surface area of the insulation layer, a transparent conductive layer is formed and subjected to patterning, thereby providing the lateral conductor traces 1124r, 1124g and 1124b and the conductive layer 1124k. The patterning is achieved by carrying out resist coating, exposure, development and etching in the order described.

Figure 32A:
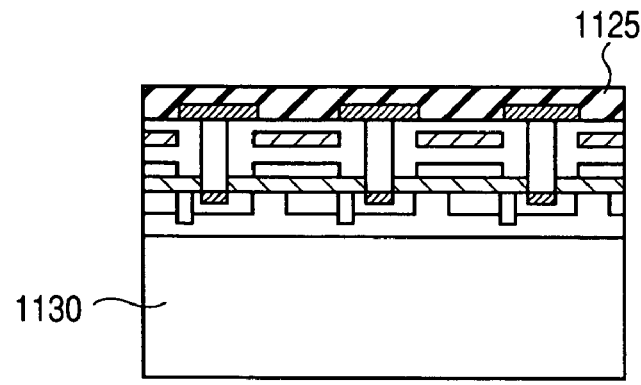
FIGS. 32A and 32B show diagrams illustrating a procedure of manufacturing the photoelectric conversion layer-stacked solid-state imaging device shown in FIG. 28 to FIG. 30.
Figure 32B:
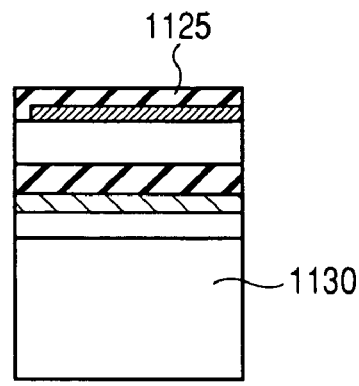
Figure 33A:
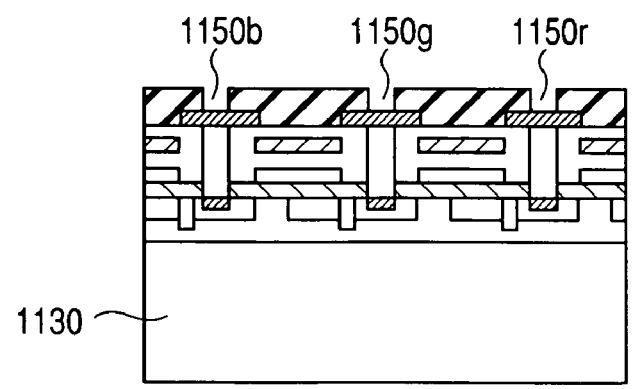
FIGS. 33A and 33B show diagrams illustrating a procedure of manufacturing the photoelectric conversion layer-stacked solid-state imaging device shown in FIG. 28 to FIG. 30.
Figure 33B:
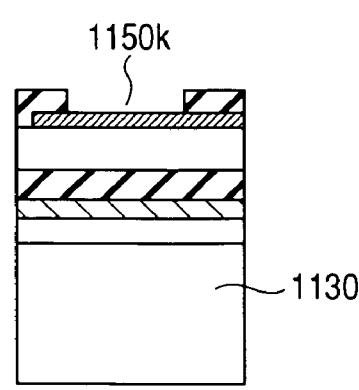
Figure 34A:
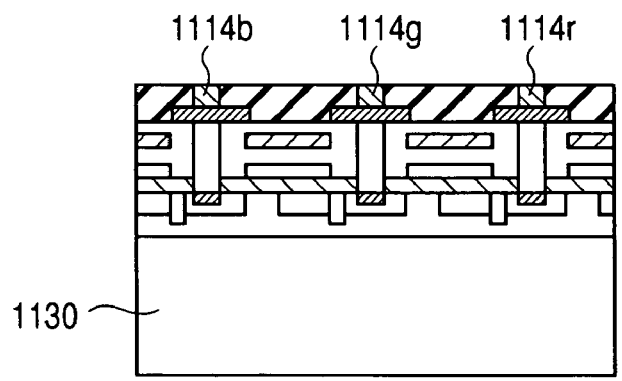
FIGS. 34A and 34B show diagrams illustrating a procedure of manufacturing the photoelectric conversion layer-stacked solid-state imaging device shown in FIG. 28 to FIG. 30.
Figure 34B:
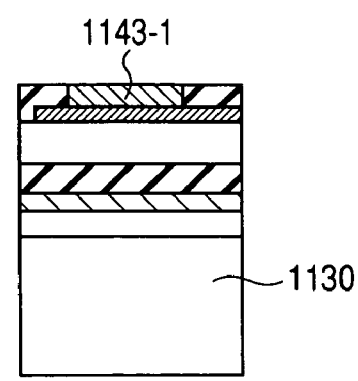
Figure 35A:
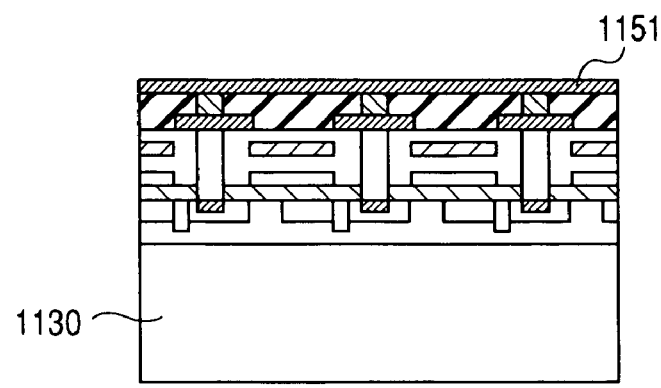
FIGS. 35A and 35B show diagrams illustrating a procedure of manufacturing the photoelectric conversion layer-stacked solid-state imaging device shown in FIG. 28 to FIG. 30.
Figure 35B:
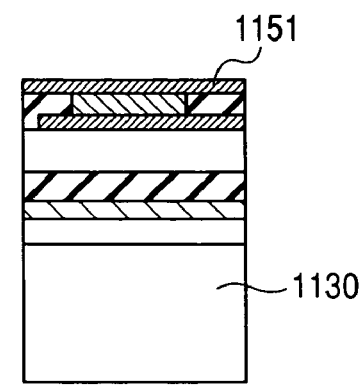

Next, as shown in FIG. 32, the insulation layer 1125 is deposited on the surface area. And therein, as shown in FIG. 33, the apertures 1150r, 1150g, 1150b and 1150k are made by etching so as to reach the lateral conductor traces 1124r, 1124g and 1124b, and the conductive layer 1124, respectively. Then, as shown in FIG. 34, the apertures 1150r, 1150g, 1150b and 1150k are filled up with a transparent conductive material, thereby forming segments of the longitudinal conductor traces 1114r, 1114g and 1114b, and the longitudinal conductor trace 1143-1 illustrated in FIG. 31. Further, as shown in FIG. 35, the transparent conductive material 1151 is formed on the surface area.

Figure 36A:
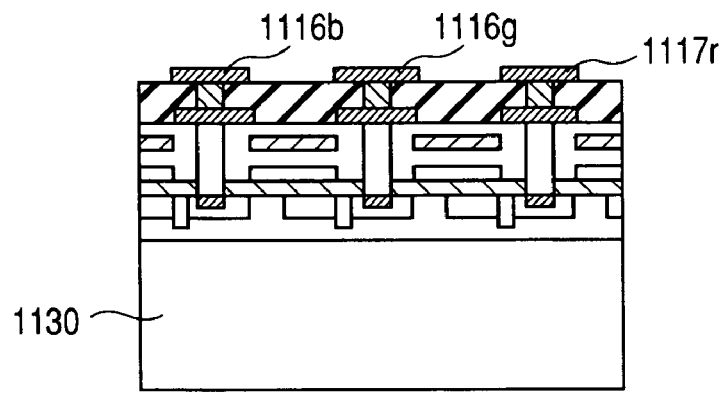
FIGS. 36A and 36B show diagrams illustrating a procedure of manufacturing the photoelectric conversion layer-stacked solid-state imaging device shown in FIG. 28 to FIG. 30.
Figure 36B:
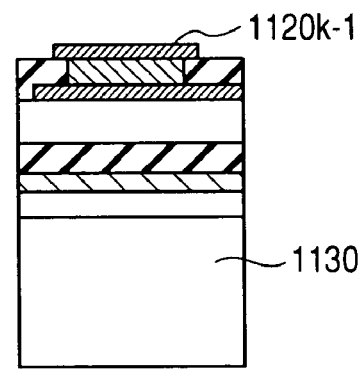
Figure 37A:
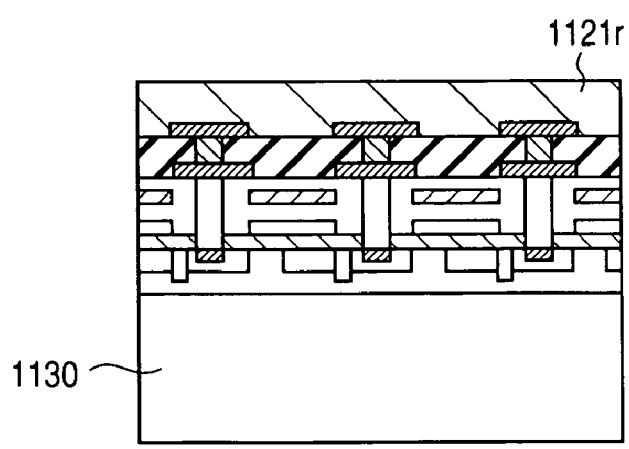
FIGS. 37A and 37B show diagrams illustrating a procedure of manufacturing the photoelectric conversion layer-stacked solid-state imaging device shown in FIG. 28 to FIG. 30.
Figure 37B:
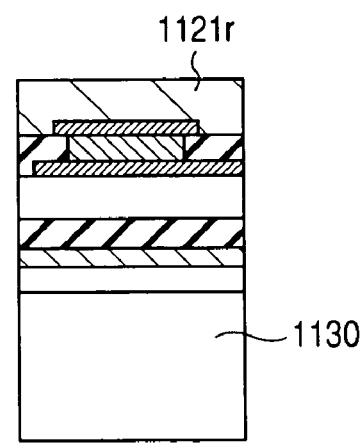
Figure 38A:
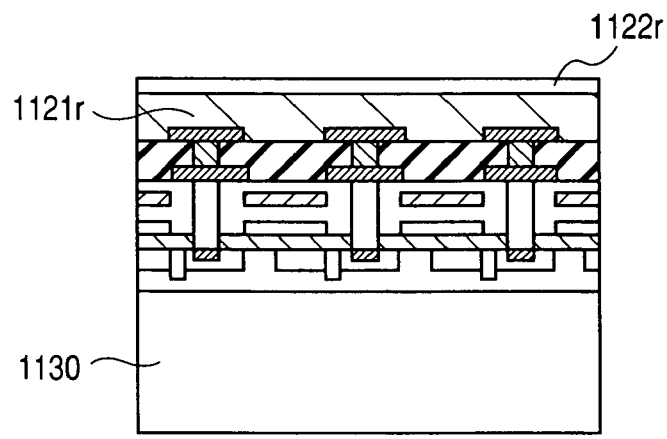
FIGS. 38A and 38B show diagrams illustrating a procedure of manufacturing the photoelectric conversion layer-stacked solid-state imaging device shown in FIG. 28 to FIG. 30.
Figure 38B:
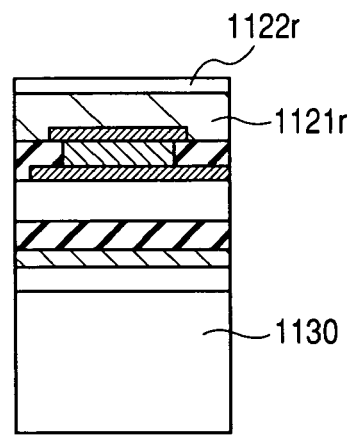

Next, as shown in FIG. 36, the patterning of the conductive layer 1151 is performed, thereby forming not only the first electrode layer 1120r but also the pad 1117r and the conductive layers 1116b, 1116g and 1120k-1 shown in FIG. 28. Thereafter, as shown in FIG. 37, the photoelectric conversion layer 1121r for detection of red color is deposited on the surface area. And further, as shown in FIG. 38, the second electrode layer 1122r is deposited on the photoelectric conversion layer 1121r.

Figure 39A:
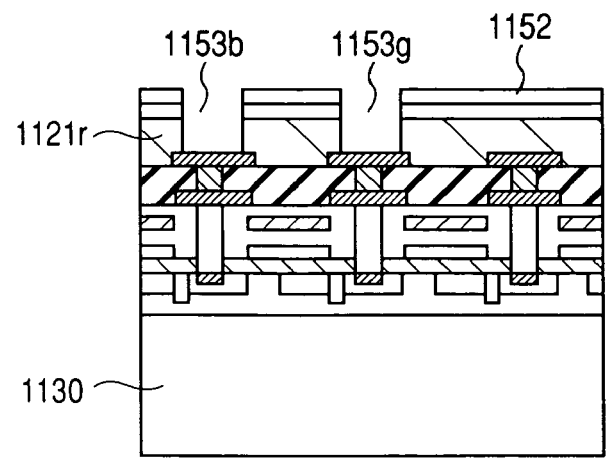
FIGS. 39A and 39B show diagrams illustrating a procedure of manufacturing the photoelectric conversion layer-stacked solid-state imaging device shown in FIG. 28 to FIG. 30.
Figure 39B:
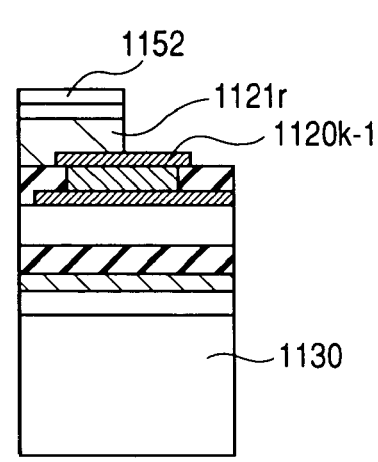

Next, as shown in FIG. 39, the resist layer 1152 is formed on the surface, and therein are formed the apertures 1153b and 1153g by etching so that they are matched to the positions of the conductive layers 1116r and 1116g, respectively. In addition, the photoelectric conversion layer 1121r on the conductive layer 1120k-1 and the edge part of the second conductive layer 1122r are cut out as shown in FIG. 39(b).

In this embodiment of the invention, the interface between the photoelectric conversion layer 1121r and the second electrode layer 1122r is free from roughness, and besides, the number of times the etching is performed in making apertures for longitudinal conductor traces can be cut down because the apertures 1153g and 1153b are formed, as mentioned above, in the process that the deposition of the photoelectric conversion layer 1121r and that of the second electrode layer 122r are carried out successively and these layers are etched at the same time. Further, since the conductive layers 1116g and 1116b are placed at the bottom of the apertures at the time of etching, the progress of etching can be caused to stop accurately at the positions of those conductive layers 1116g and 1116b.

Figure 40A:
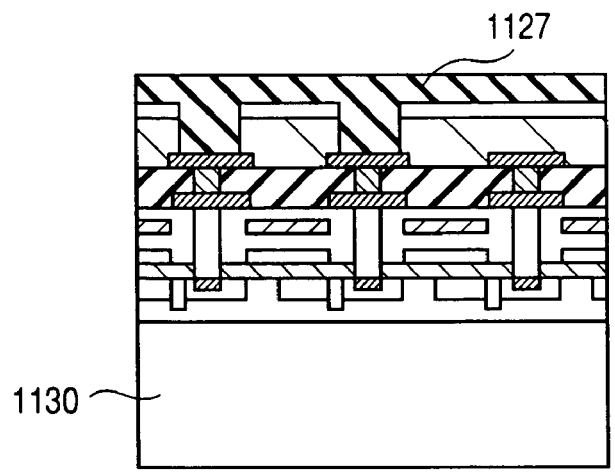
FIGS. 40A and 40B show diagrams illustrating a procedure of manufacturing the photoelectric conversion layer-stacked solid-state imaging device shown in FIG. 28 to FIG. 30.
Figure 40B:
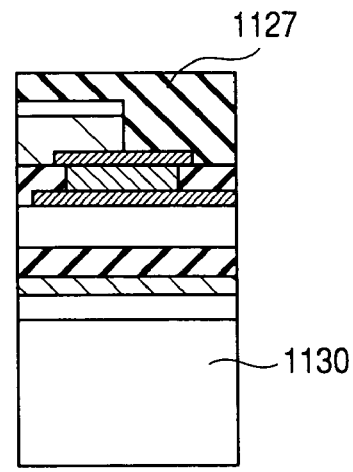
Figure 41A:
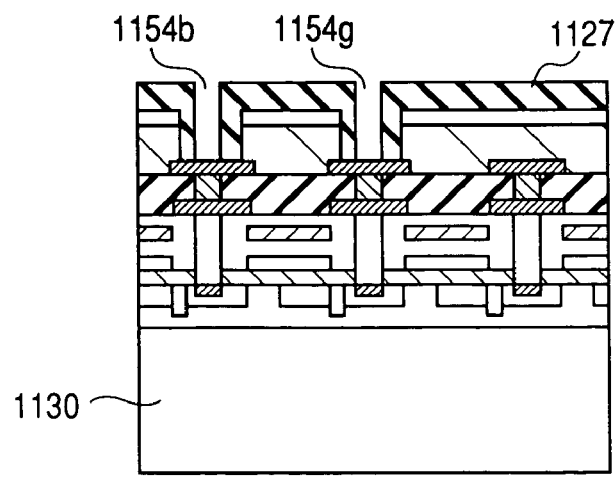
FIGS. 41A and 41B show diagrams illustrating a procedure of manufacturing the photoelectric conversion layer-stacked solid-state imaging device shown in FIG. 28 to FIG. 30.
Figure 41B:
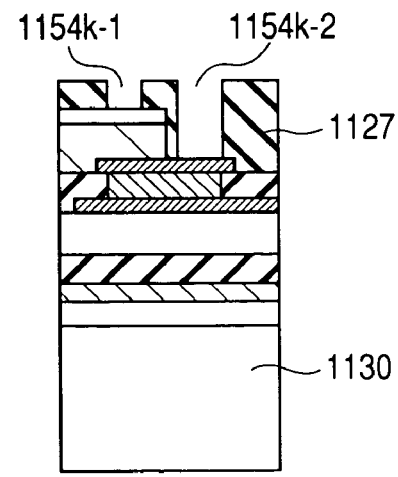

After formation of the apertures 1153b and 1153g, as shown in FIG. 40, the insulation layer 127 is applied to the surface area, and therewith the apertures are filled up and at the same time, as shown in FIG. 40(b), the insulation layer 1127 is also applied to the part cut out in the previous step. Then, as shown in FIG. 41, the apertures 1154g and 1154b having a diameter smaller than that of the apertures 1153g and 1153b are made by etching, and at the same time, in the edge part (FIG. 40(b)) are made the aperture 1154k-1 reaching the second electrode layer 1122r and the aperture 1154-2 reaching the conductive layer 1120k-1.

Figure 42A:
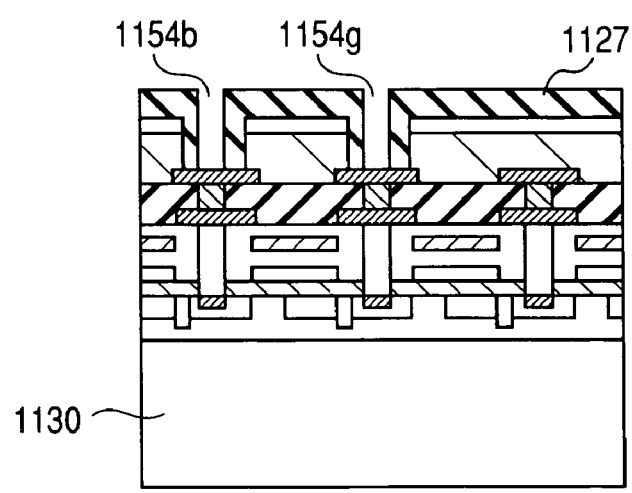
FIGS. 42A and 42B show diagrams illustrating a procedure of manufacturing the photoelectric conversion layer-stacked solid-state imaging device shown in FIG. 28 to FIG. 30.
Figure 42B:
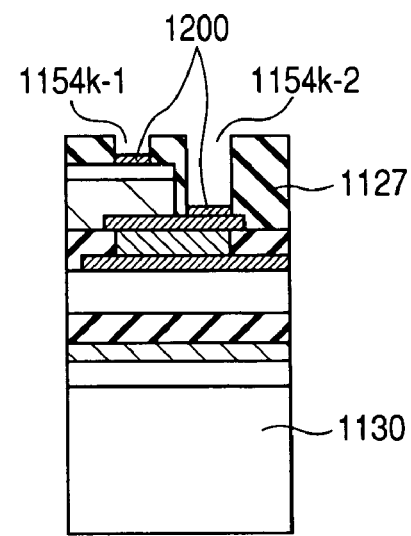

Next, as shown in FIG. 42(b), on the partial areas of the second electrode layer 1122r and the conductive layer 1120k-1, which are made bare by making the apertures 1154k-1 and 1154k-2, the barrier metal 1200 is formed by selective growth.

Figure 43A:
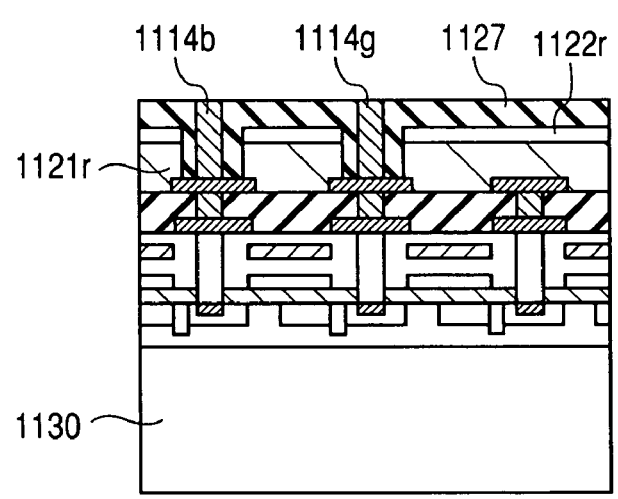
FIGS. 43A and 43B show diagrams illustrating a procedure of manufacturing the photoelectric conversion layer-stacked solid-state imaging device shown in FIG. 28 to FIG. 30.
Figure 43B:
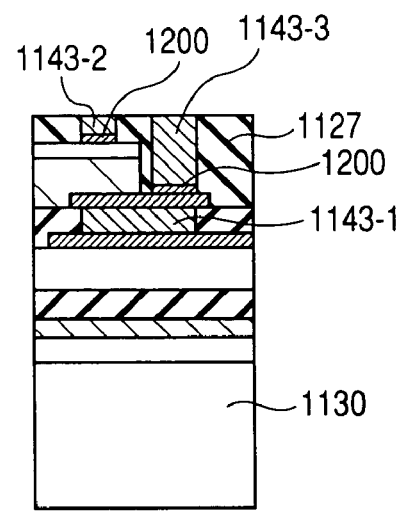

Next, as shown in FIG. 43, the apertures 1154g, 1154b, 1154k-1 and 1154k-2 are filled up with a transparent conductive material, thereby forming the longitudinal conductor traces 1114g, 1114b, 1143-2 and 1143-3. After filling up each aperture with the transparent conductive material, the surface is subjected to smoothening treatment. This treatment is performed by etch back or CMP (chemical mechanical polishing).

In this embodiment of the invention, as mentioned above, the longitudinal conductor traces 1114g and 1114b passing through three layers, namely the insulation layer 1127, the second electrode layer 1122r and the photoelectric conversion layer 1121r, are produced in one process step; as a result, the number of process steps for producing the longitudinal conductor traces required can be reduced.

Figure 44A:
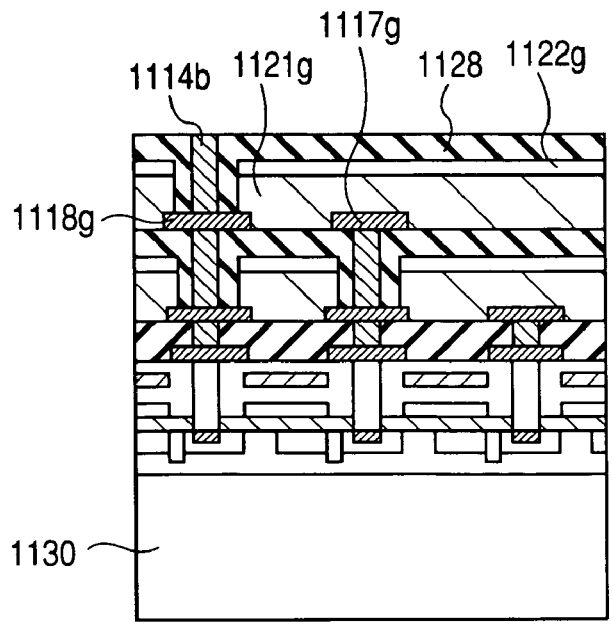
FIGS. 44A and 44B show diagrams illustrating a procedure of manufacturing the photoelectric conversion layer-stacked solid-state imaging device shown in FIG. 28 to FIG. 30.
Figure 44B:
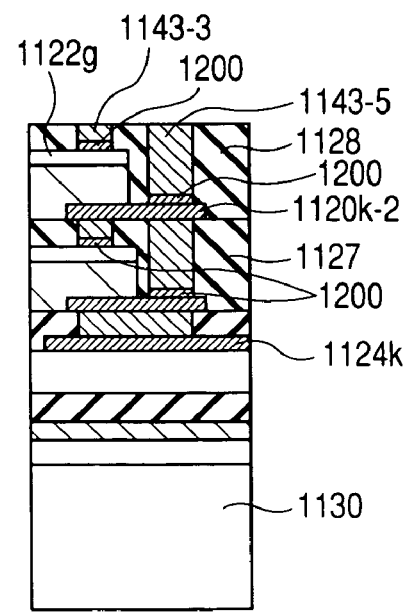

By repeating the procedure similar to the manufacturing procedure shown in FIGS. 35 through 43, the longitudinal conductor trace 1114b passing through the photoelectric conversion layer 1121g for detection of green color and the second electrode layer 1122g is formed and, at the same time, the longitudinal conductor traces 1143-4 and 1143-5 are formed in the edge part as shown in FIG. 44.

Figure 45A:
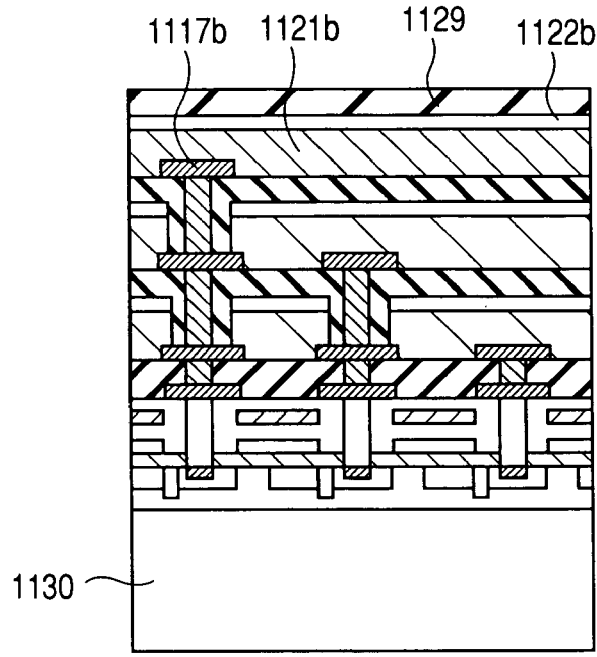
FIGS. 45A and 45B show diagrams illustrating a procedure of manufacturing the photoelectric conversion layer-stacked solid-state imaging device shown in FIG. 28 to FIG. 30.
Figure 45B:
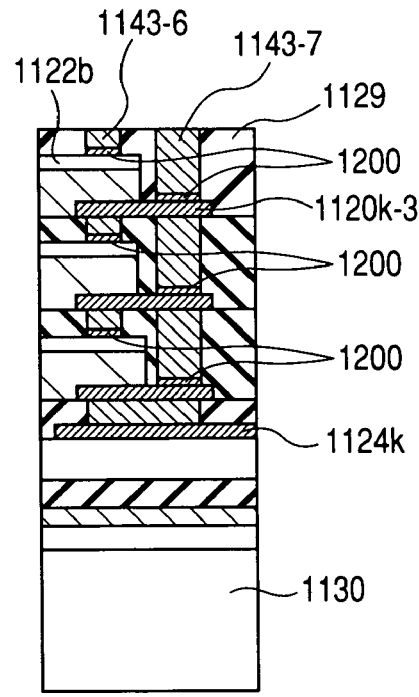
Figure 46A:
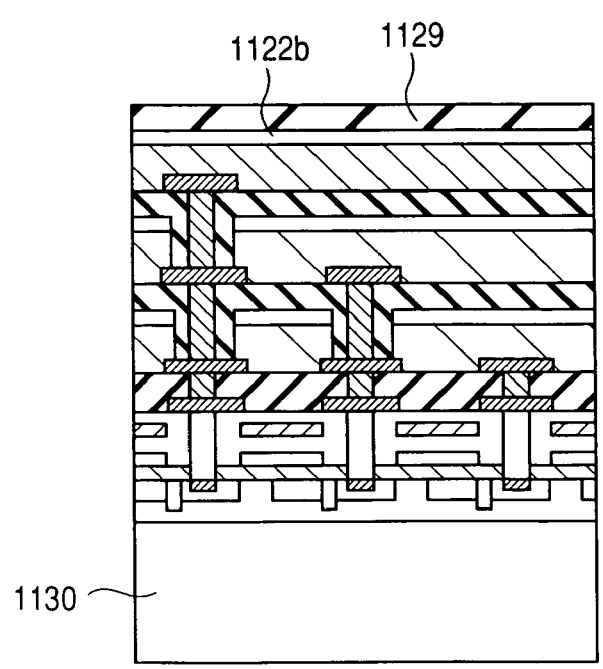
FIGS. 46A and 46B show diagrams illustrating a procedure of manufacturing the photoelectric conversion layer-stacked solid-state imaging device shown in FIG. 28 to FIG. 30.
Figure 46B:
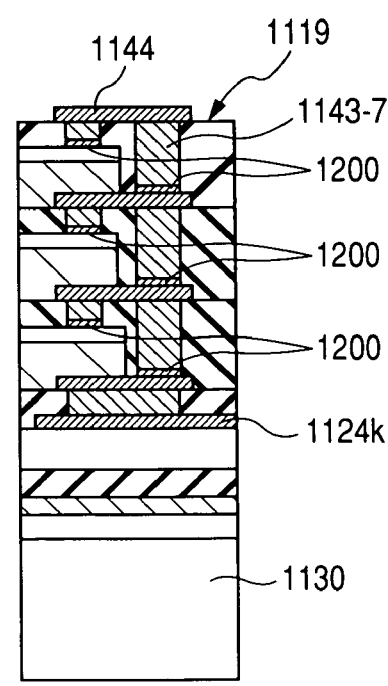

Further, as shown in FIG. 45, the first electrode layer 1120b and the pad 1117b are formed, and thereon are formed the photoelectric conversion layer 1121b for detection of blue color, the second electrode layer 1122b and the transparent protective layer 1129. In predetermined places of the transparent protective layer 1129, apertures are made by etching, and filled up with a conductive material to form the longitudinal conductor traces 1143-6 and 1143-7. Finally, as shown in FIG. 46, the conductive layer 1144 connecting between the longitudinal conductor trace 1143-6 and the longitudinal conductor trace 1143-7 is formed.

In this embodiment of the invention, as described above, the interface between each photoelectric conversion layer and each second electrode layer is free from roughness, and besides, the number of times the etching is performed in making apertures for longitudinal conductor traces can be cut down because the deposition of the photoelectric conversion layer and that of the second electrode layer are carried out successively and these layers are etched at the same time to make apertures. As a result, not only enhancement of the photo electric conversion capability but also reduction in production cost can be achieved.

Although the foregoing is illustration of an example of the three-layer structure, the following is illustration of a transformational example of the manufacturing process of the foregoing photoelectric conversion layer-stacked solid-state imaging device.

FIGS. 47 through 53 are diagrams showing an transformational example of the manufacturing process from the step shown in FIG. 38 to the step shown in FIG. 41. In FIGS. 47 through 53, only the region located underneath the aperture 1154b is shown diagrammatically.

Figure 47:
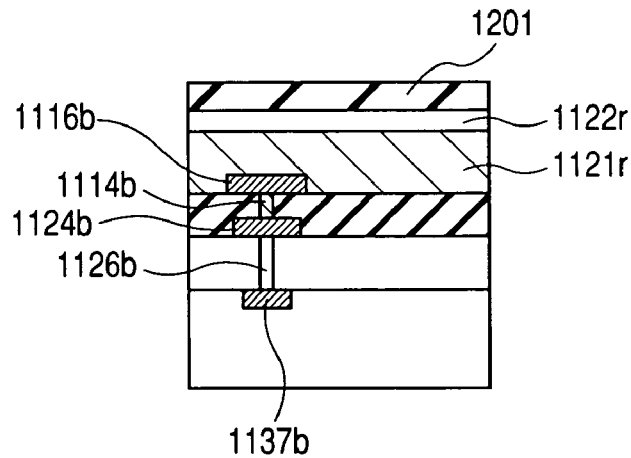
FIG. 47 is a diagram illustrating a variant of the procedure of manufacturing the photoelectric conversion layer-stacked solid-state imaging device shown in FIG. 28 to FIG. 30.
Figure 48:
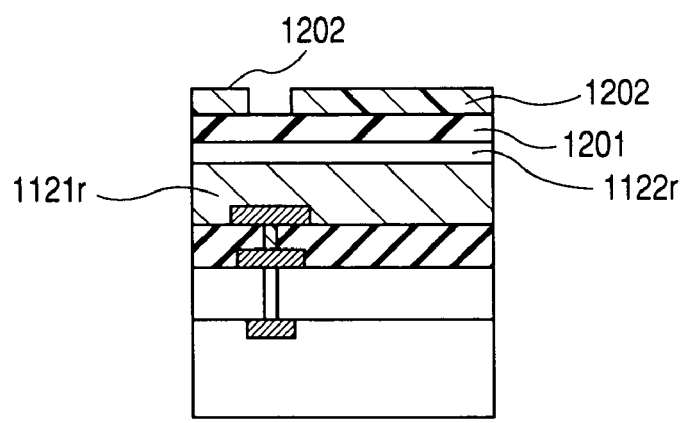
FIG. 48 is a diagram illustrating a variant of the procedure of manufacturing the photoelectric conversion layer-stacked solid-state imaging device shown in FIG. 28 to FIG. 30.
Figure 49:
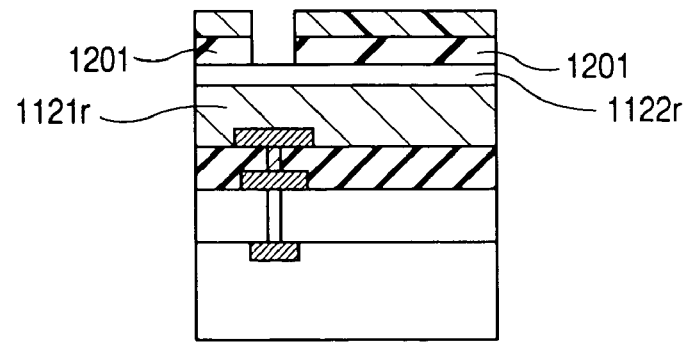
FIG. 49 is a diagram illustrating a variant of the procedure of manufacturing the photoelectric conversion layer-stacked solid-state imaging device shown in FIG. 28 to FIG. 30.
Figure 50:
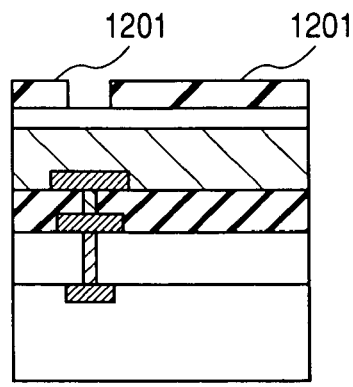
FIG. 50 is a diagram illustrating a variant of the procedure of manufacturing the photoelectric conversion layer-stacked solid-state imaging device shown in FIG. 28 to FIG. 30.
Figure 51:
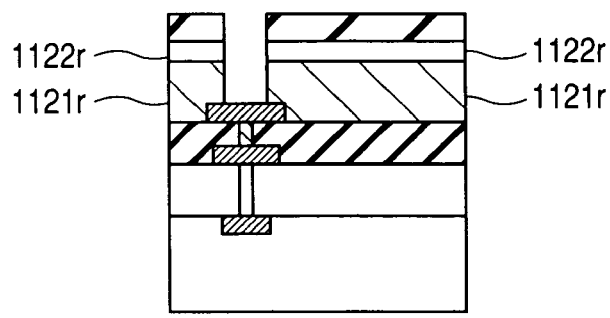
FIG. 51 is a diagram illustrating a variant of the procedure of manufacturing the photoelectric conversion layer-stacked solid-state imaging device shown in FIG. 28 to FIG. 30.
Figure 52:
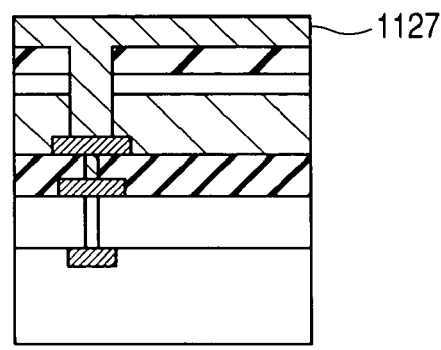
FIG. 52 is a diagram illustrating a variant of the procedure of manufacturing the photoelectric conversion layer-stacked solid-state imaging device shown in FIG. 28 to FIG. 30.
Figure 53:
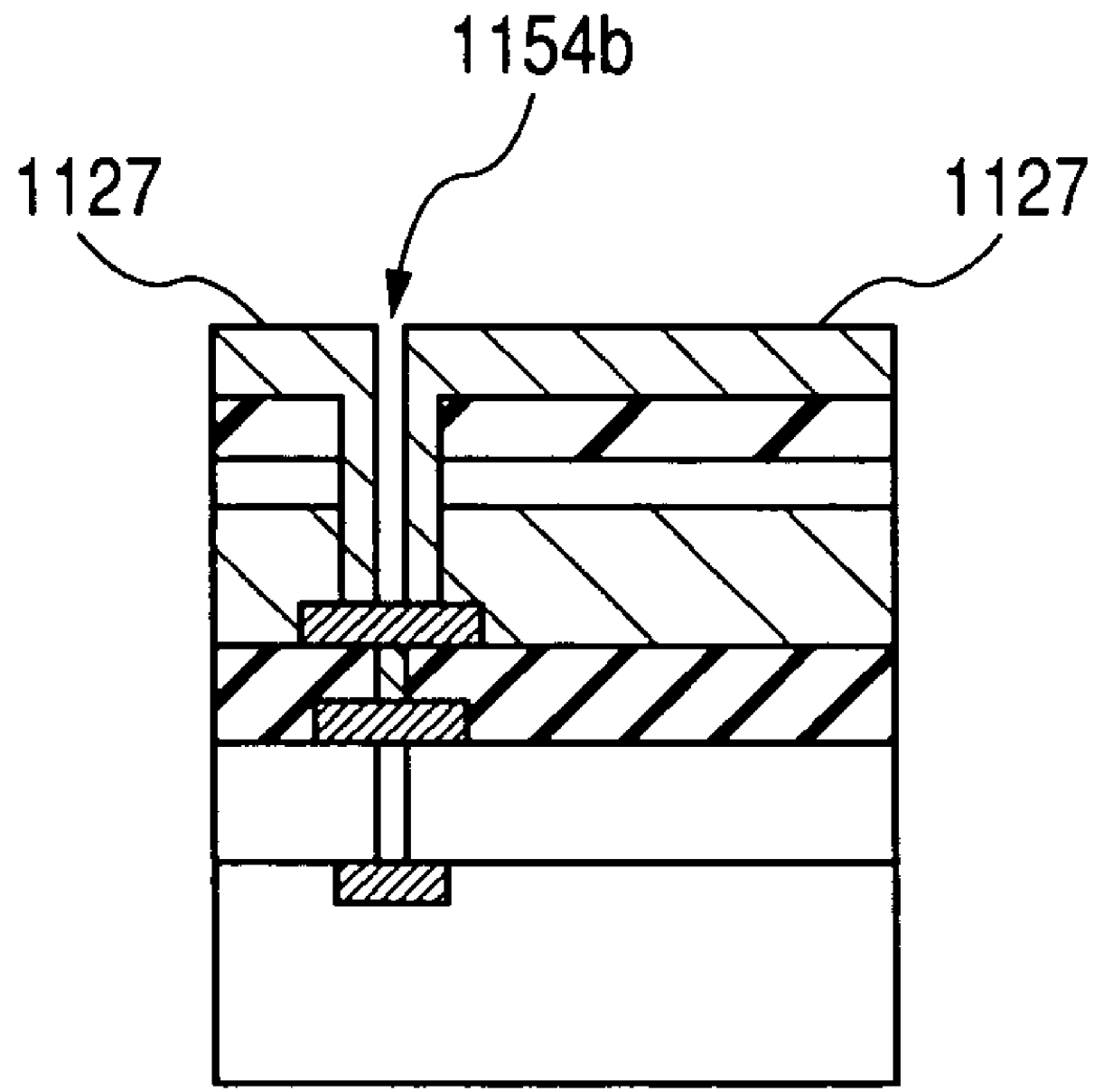
FIG. 53 is a diagram illustrating a variant of the procedure of manufacturing the photoelectric conversion layer-stacked solid-state imaging device shown in FIG. 28 to FIG. 30.

After forming the second electrode layer 1122r, as shown in FIG. 47, the insulation layer 1201 is formed. Then, as shown in FIG. 48, the resist pattern 1202 is formed on the insulation layer 1201. With the aid of this resist pattern 1202, the insulation layer 1201 alone is etched as shown in FIG. 49. Next, as shown in FIG. 50, the resist pattern 1202 is removed. When the second electrode layer 1122r has a protective function, the resist pattern can be removed by wet treatment using a stripping solution. Of course, it is also possible to etch the second electrode layer 1122r and the photoelectric conversion layer 1121r in the state shown in FIG. 49, provided that there is resist treatment not causing damage to the photoelectric conversion layer 1121r. Next, as shown in FIG. 51, the insulation layer 1201 is used as mask and the second electrode layer 1122r and the photoelectric conversion layer 1121r are etched. Further, as shown in FIG. 52, the leveling is carried out by forming the insulation layer 1127, and then the via hole 1154b is made as shown in FIG. 53.

When the photoelectric conversion layer is susceptible to damage, the photoelectric conversion layer cannot be protected from damage at the time of resist formation in the step shown in FIG. 39 because the second electrode layer alone lies beneath the resist. During the formation of resist, the steps of applying a solvent, processing with an alkali developer and washing are performed, so device performance deterioration occurs immediately so far as the photoelectric conversion layer is susceptible to such processing. This deterioration is considerable, particularly when the photoelectric conversion layer includes an organic material. Looking at FIG. 48, however, the whole surface of the photoelectric conversion layer is protected by the insulation layer during the resist formation, so it suffers no deterioration and the device characteristics are prevented from deteriorating.

Fourth Embodiment

The configuration of charge accumulation zones formed in the silicone substrate is a tetragonal lattice array in the case of the photoelectric conversion layer-stacked solid-state imaging device illustrated in the third embodiment of the invention, but various configurations may be adopted without limiting to the above. For instance, the so-called honeycomb configuration can be adopted, wherein the charge accumulation zone sequences, which each are made up of charge accumulation zones aligned in the vertical direction, are arranged in a staggered condition by shifting either of each odd number sequence and the even number sequence adjacent thereto in the vertical direction by about ½ of their sequence pitches in the vertical direction. The detailed makeup of honeycomb configuration is disclosed, e.g., in JP-A-10-136391.

Figure 54:
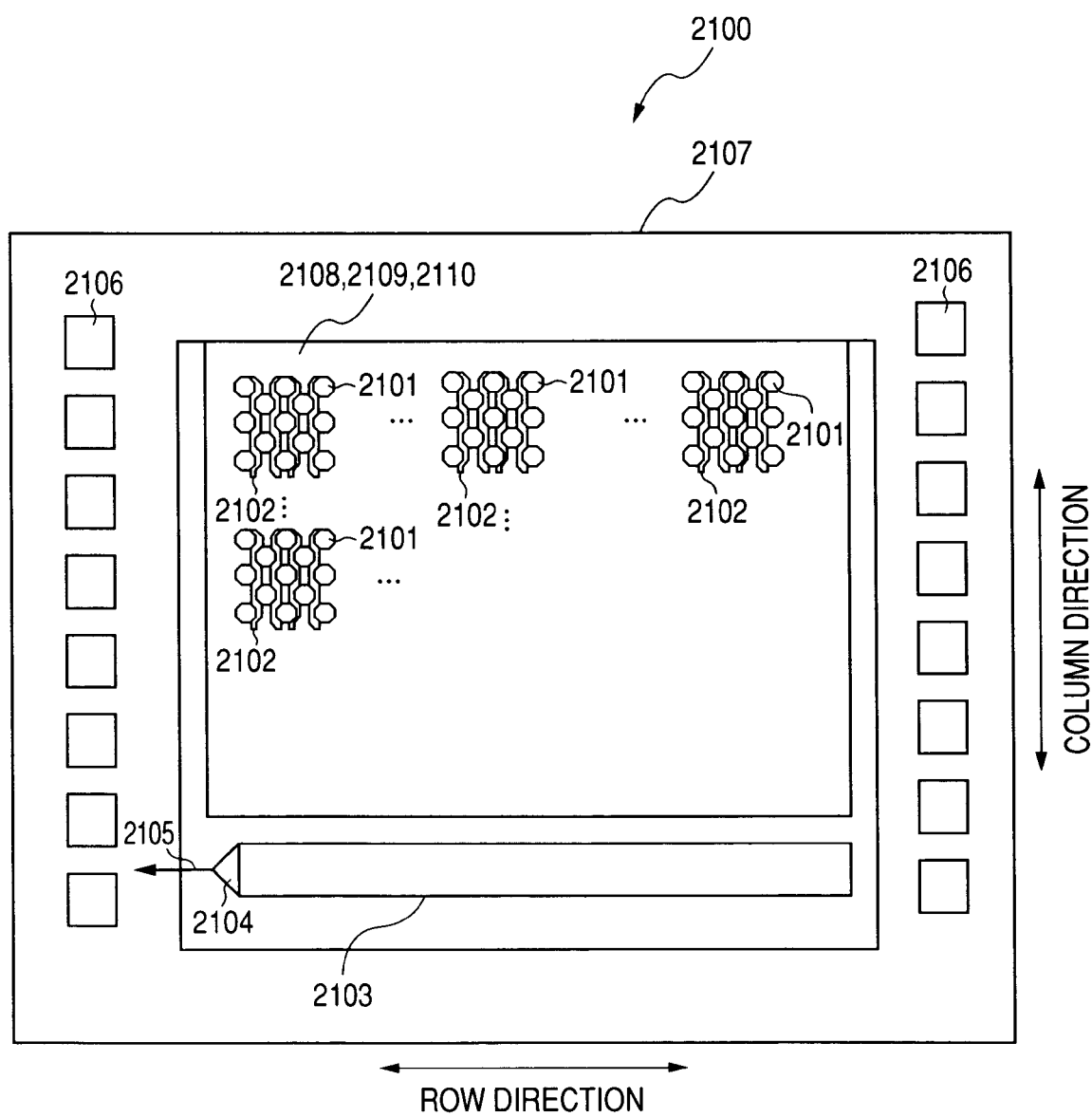
FIG. 54 is a schematic surface view of a photoelectric conversion layer-stacked solid-state imaging device for illustrating a fourth embodiment of the invention.

FIG. 54 is a schematic surface view of a photoelectric conversion layer-stacked solid-state imaging device for illustrating a fourth embodiment of the invention.

In the photoelectric conversion layer-stacked solid-state imaging device 2100, a great many charge accumulation zones 2101 are arrayed on the surface of the silicone substrate 2107, and the configuration thereof is the honeycomb configuration as disclosed in JP-A-10-106391. On the surface of the silicon substrate, vertical transfer lines 2102 (column-wise CCD resistors) are formed so that each of them corresponds to each sequence made up of charge accumulation zones 2101 aligned in the column-wise direction, and in the lower hem region of the silicon substrate is formed a horizontal transfer line (row-wise CCD resistor) 2103. Further, an amplifier 2104 is placed in the outlet portion of the horizontal transfer line 2103, and signal charges are amplified thereby and output as output signals 2105. On the both sides of the silicon substrate 2107, the bonding PADs 2106 for power supply are provided. Further, three photoelectric conversion layers 2108 are deposited on the silicone substrate 2107 and each of them is sandwiched in between the first electrode layer 2109, which is divided among pixels, and the second electrode layer 2110, which is not divided among pixels. The bonding PADs are connected via conductor traces to those first electrode layers and to those second electrode layers.

Figure 55:
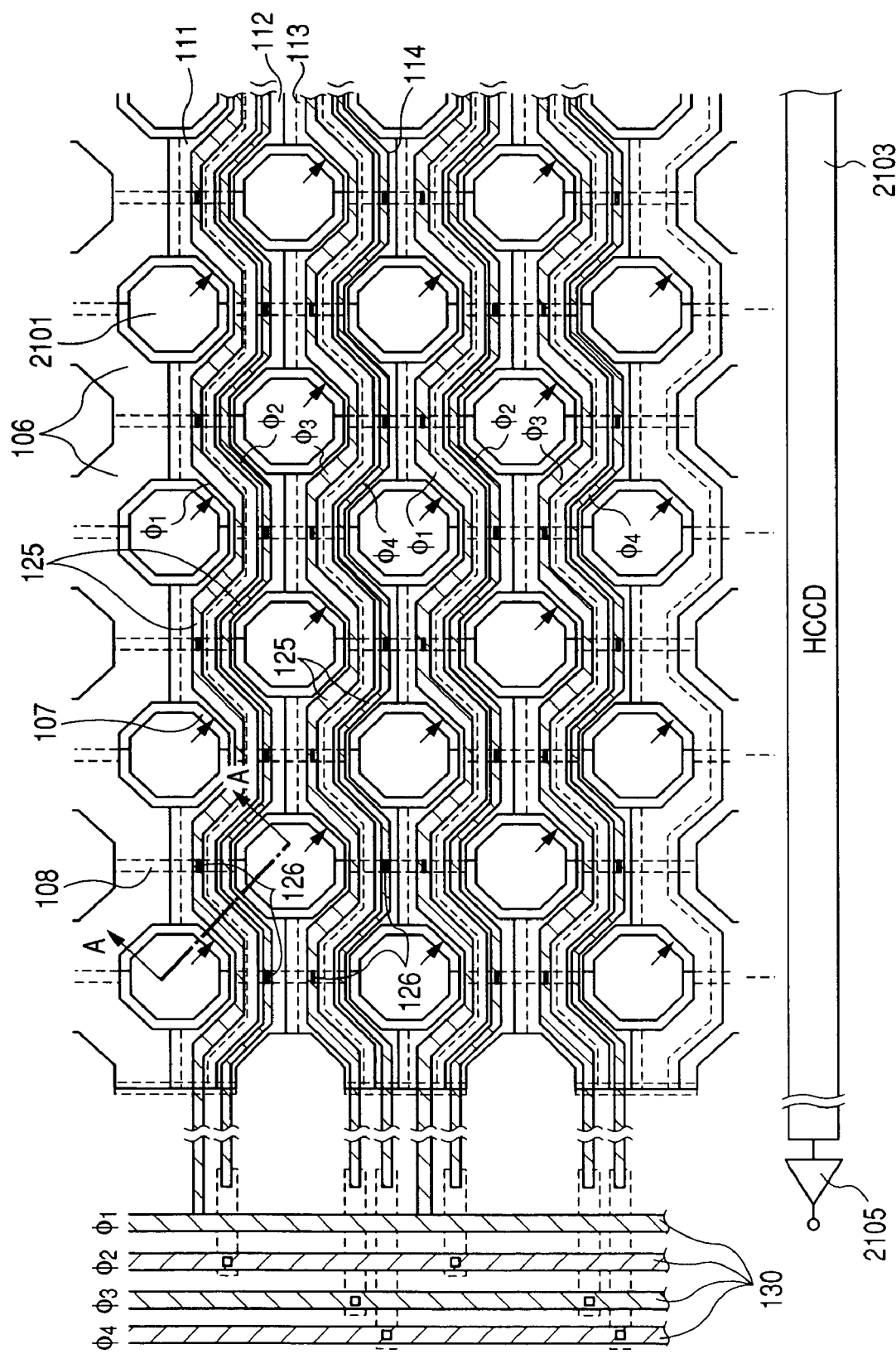
FIG. 55 is a partial enlargement of the diagram of the solid-state imaging device shown in FIG. 54.
Figure 56:
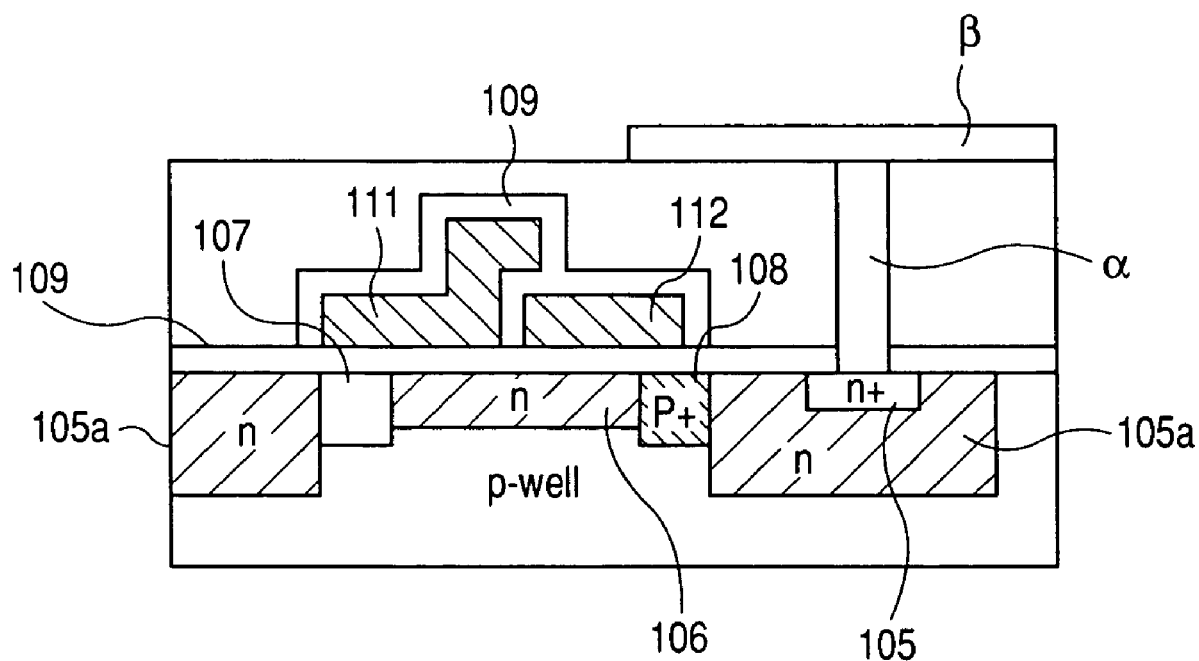
FIG. 56 is a schematic cross-sectional view taken on line A-A of FIG. 55 showing the solid-state imaging device.

FIG. 55 is a partial enlargement of the diagram of the solid-state imaging device shown in FIG. 54. FIG. 56 is a schematic cross-sectional view taken on line A-A of FIG. 55 showing the solid-state imaging device.

In the solid-state imaging device shown in FIG. 55, as mentioned above, the charge accumulation zones 2101 and their adjacent vertical transfer lines 2102 which are each made up of vertical transfer channels 106 and transfer electrodes 111 to 114 are arranged in a two-dimensional plane state. To one charge accumulation zone 2101, the transfer electrodes 111 to 114 for supplying 4-phase transfer pulses $\phi 1$ to $\phi 4$ are installed. Each of the transfer electrodes 111 to 114 is formed in a condition that it is extended in the row-wise direction and meanders so as to avoid the charge accumulation zones 2101.

Signal charges generate in each photoelectric conversion layer and accumulated in each charge accumulation zone 2101 are read out from the readout gate 107 set in the right lower position in the diagram to the vertical transfer channel 106. The vertical transfer channel 106 adjacent to each charge accumulation zone 2101 ranges in the longitudinal direction, from the upper to the lower, in FIG. 55, extends in the column-wise direction while meandering between the charge accumulation zones 2101 arranged in the honeycomb pattern, and forms each vertical transfer line 2102 together with the transfer electrodes 111 to 114. The terminal of each vertical transfer line 2102 is connected to the light-shielded horizontal transfer line 2103. Further, the end of the horizontal transfer 2103 is connected to the amplifier 2104 having a floating diffusion amplifier (FDA), from which signals responsive to signal charges are output.

The charge accumulation zone 2101, as shown in FIG. 56, is structured so that the n+ zone 105b is formed in the N-type high impurity concentration layer 105a. On the n+ zone 105a, the plug α is provided, and thereon is deposited the first electrode layer β. In the upper part of the vertical transfer channel 106 are formed the transfer electrodes 111, 112, 113 and 114 by means of a polycrystalline silicon electrode of two-layer structure. The polycrystalline silicon electrode of two-layer structure forms the transfer electrodes 111 and 113, and then forms the transfer electrodes 112 and 114 via the insulation layer 109 so that these electrodes overlap at their ends. Operation of the vertical transfer line 2102 by application of 4-phase transfer pulses, e.g., $\phi 1$, $\phi 2$, $\phi 3$ and $\phi 4$ by means of those transfer electrodes 111, 112, 113 and 114 enables total pixel readout.

At one side of the periphery of the N-type high impurity concentration layer 105a is provided the readout gate 107 for reading out charges accumulated by photoelectric conversion to the vertical transfer channel 106, and at the other side is formed the P-type highly concentrated impurity-utilized element separation zone 108 (channel stop) for damming up the flow of charge to vertical transfer channels of adjacent pixel sequences in the top-to-bottom direction.

The solid-state imaging device thus configured can respond to total pixel readout even when the transfer electrodes for driving column-wise CCD resistors take a two-layer polycrystalline silicone structure, so the manufacturing process can be simplified. In addition, four electrodes can be placed for each charge accumulation zone. In this case, the operation by 4-phase transfer pulses can increase the throughput of charge by about 1.5 times, compared with the case of the 3-phase operation. And the honeycomb CCD structure enables each charge accumulation zone to have a relatively large area, compared with traditional rectangular-lattice CCDs, and besides, it ensures high horizontal and vertical resolutions, and thereby permits production of highly sensitive solid-state imaging devices even when there is progress toward microminiaturization (increase in density and number of pixels).

In this embodiment of the invention, for the purpose of lowering the electric resistance of polycrystalline silicon electrode used as the transfer electrodes 111 to 114, the polycrystalline silicon electrode has the so-called metal-lined structure formed by depositing an electrode material smaller in specific resistance than the polycrystalline silicon, such as Al (aluminum) or W (tungsten), as a metal trace 125 on the polycrystalline silicon electrode via an insulation layer. This metal trace 125 is connected electrically to the transfer electrodes 111 to 114 through contact holes, respectively. According to the honeycomb configuration as in this embodiment of the invention, in contrast to the traditional rectangular-lattice array, the metal traces 125 can be installed in correspondence with the transfer electrodes 111 to 114 in all phases (layers) in a state of meandering along the direction of the length of the polycrystalline silicon electrode of two-layer structure, namely the lateral (horizontal) direction in the figure.

Each of these metal traces 125 is extended in the lateral direction in the figure, and its end is connected electrically to the trace pattern 130 for transmitting transfer pulses for operation, φ1 to φ4, supplied from the outside of the device. In the case shown in FIG. 55, the metal traces 125 and the trace pattern 130 are made of Al, and crossing spots of metal traces 125 and the trace pattern 130 in a different phase are configured such that the wiring is carried out by forming the trace pattern 130 on the polycrystalline silicon electrode via an insulation layer and the metal traces 125, the trace pattern 130 and the polycrystalline silicon electrodes are made electrically continuous at the contact spots.

Suitable examples of an electrode material include Al, W, Cu (copper), Ti (titanium), Co (cobalt), Ni (nickel), Pd (palladium), Pt (platinum), nitrides of these metals, silicides (such as WSi (tungsten silicide) and TiSi (titanium silicide)), and alloys, compounds and composites containing the metals recited above. Al is easy to machine and to handle, and that small in electric resistance, so it is used for lined metal traces quite often. In contrast to Al, W cannot be alloyed with polycrystalline silicon, so it little causes potential shift (partial change in potential) by alloy formation and enables efficient charge transfer in vertical transfer lines. In addition, W is usable for light-shielding layer of solid-state imaging devices, so it may be used in common with lightproof layer portions.

What is claimed is:

1. A functional device comprising: at least one functional layer which contains an organic material deposited over a substrate; and a plurality of electrodes for bringing the functional layer into action,
    wherein the plurality of electrodes are a first electrode layer deposited over the substrate and a second electrode layer formed above the first electrode layer and opposite to the first electrode layer across the functional layer and
    wherein the second electrode layer has a double-layer structure of two electrode layers, one of the two electrode layers having an aperture, and
    a barrier metal layer formed in contact with the other of the two electrode layers and located between a wiring inside the aperture and the other of the two electrode layers.

2. The functional device according to claim 1, wherein the functional device has two or more layer structures deposited over the substrate, each of which comprises the first electrode layer, the functional layer and the second electrode layer.

3. The functional device according to claim 1, wherein each of the first electrode layer and the second electrode layer includes at least one of ITO, IZO, $SnO_2$, ATO, ZnO, $TiO_2$ or FTO.

4. The functional device according to claim 1, wherein the second electrode layer is a transparent conductive oxide layer and the wiring contains aluminum.

5. The functional device according to claim 1, wherein the organic material includes at least a hole transporting organic material and an electron transporting organic material.

6. The functional device according to claim 5, wherein the hole transporting organic material and the electron transporting organic material are deposited in this order from lower to upper.

7. The functional device according to claim 6, wherein the functional layer is a layer which functions as to form an image, the second electrode layer is formed so as to be divided among pixels, and each of the pixels has a spot at which the second electrode layer and the wiring are kept in contact with each other.

8. The functional device according to claim 1, wherein the barrier metal is made up of any of TaN, Ta, WN, TiW, WSi, TiSi, MoSi, Mo, Cr, TiN and TiSiN.

9. The functional device according to claim 1, wherein the barrier metal is provided in an aperture made in at least one insulation layer and the insulation layer has water permeability of 10 $g/m^2 \cdot day$ or below.

10. The functional device according to claim 1, wherein the barrier metal is 1 mm or below in the smallest edge length.

11. The functional device according to claim 1, wherein the functional layer is a photoelectric conversion layer.

12. The functional device according to claim 1, wherein the functional layer is a luminescent layer.

13. The functional device according to claim 1, wherein the other of the two electrode layers is located on a side closer to the functional layer and is connected to the wiring via the barrier metal.

* * * * *